(12) United States Patent
Shinohara et al.

(10) Patent No.: US 6,777,257 B2
(45) Date of Patent: Aug. 17, 2004

(54) METHOD OF FABRICATING A LIGHT EMITTING DEVICE AND LIGHT EMITTING DEVICE

(75) Inventors: Masayuki Shinohara, Annaka (JP); Masato Yamada, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 10/436,440

(22) Filed: May 13, 2003

(65) Prior Publication Data

US 2003/0219918 A1 Nov. 27, 2003

(30) Foreign Application Priority Data

| May 17, 2002 | (JP) | 2002-143713 |
|---|---|---|
| May 17, 2002 | (JP) | 2002-143782 |
| May 17, 2002 | (JP) | 2002-143783 |
| May 17, 2002 | (JP) | 2002-143784 |
| Sep. 30, 2002 | (JP) | 2002-287421 |
| May 1, 2003 | (JP) | 2003-126650 |

(51) Int. Cl.$^7$ .................................... H01L 21/00
(52) U.S. Cl. ...................... 438/45; 438/46; 438/47
(58) Field of Search ............... 438/22, 45, 46, 438/47

(56) References Cited

U.S. PATENT DOCUMENTS

| 5,233,204 A | | 8/1993 | Fletcher et al. |
|---|---|---|---|
| 5,442,203 A | | 8/1995 | Adomi et al. |
| 5,506,423 A | * | 4/1996 | Saeki ........................ 257/97 |
| 5,811,839 A | * | 9/1998 | Shimoyama et al. ...... 257/94 |
| 6,069,021 A | * | 5/2000 | Terashima et al. ......... 438/46 |
| 6,533,874 B1 | * | 3/2003 | Vaudo et al. .............. 148/33.5 |
| 6,682,950 B2 | * | 1/2004 | Yang et al. ................. 438/47 |

FOREIGN PATENT DOCUMENTS

| JP | 51144185 | 12/1976 |
|---|---|---|
| JP | 5275740 | 10/1993 |
| JP | 7066455 | 3/1995 |

* cited by examiner

Primary Examiner—T. N. Quach
(74) Attorney, Agent, or Firm—Snider & Associates; Ronald R. Snider

(57) ABSTRACT

In the light emitting device having, a light emitting layer portion and a current spreading layer, respectively composed of a Group III-V compound semiconductor, formed on a single crystal substrate, the light emitting layer portion is formed on the single crystal substrate by the metal organic vapor-phase epitaxy process, and on such light emitting layer portion the current spreading layer is formed by the hydride vapor-phase epitaxy process. A high-concentration doped layer is also formed in a surficial area including the main surface on the electrode forming side of the current spreading layer, so as to have a carrier concentration of p-type dopant higher than that in the residual portion of the current spreading layer. A current blocking layer which comprises a Group III-V compound semiconductor having a conductivity type different from that of the current spreading layer is formed in the midway in the thickness-wise direction of the current spreading layer as being buried therein At least a portion of the current spreading layer covering the current blocking layer on the electrode side is formed by the hydride vapor-phase epitaxy process (the second vapor-phase growth step). The current spreading layer is composed of $GaAs_{1-a}P_a$ ($0.5 \leq a \leq 0.9$). An off-angled substrate is available as the single crystal substrate.

55 Claims, 23 Drawing Sheets

AREA "A"

AREA "A"

METHOD OF FABRICATING A LIGHT EMITTING DEVICE AND LIGHT EMITTING DEVICE

RELATED APPLICATION

This application claims the priorities of Japanese Patent Application No. 2002-143783 filed on May 17, 2002, 2002-143713 filed on May 17, 2002, 2002-143784 filed on May 17 2002, 2002-143782 filed on May 17, 2002, 2002-287421 filed on Sep. 30, 2002 and 2003-126650 filed on May 1, 2003.

BACKGROUND OF THE INVENTION

1. Field of the Invention

The invention relates to a method of fabricating a light emitting device, and a light emitting device.

2. Description of the Related Art

Light emitting devices having the light emitting layer portion thereof composed of $(Al_xGa_{1-x})_yIn_{1-y}P$ (where, $0 \leq x \leq 1$ and $0 \leq y \leq 1$, referred to AlGaInP alloy, or more simply AlGaInP, hereinafter) alloy can achieve a high luminance by adopting a double heterostructure in which a thin AlGaInP active layer is sandwiched between an n-type AlGaInP cladding layer and a p-type AlGaInP cladding layer which have a larger band gap.

Referring now to AlGaInP light emitting device, an n-type GaAs buffer layer, an n-type AlGaInP cladding layer, an AlGaInP active layer, and a p-type AlGaInP cladding layer are stacked in this order on an n-type GaAs substrate, to thereby form a light emitting layer portion having a double heterostructure Current supply to the light emitting layer portion is generally accomplished via a metal electrode formed on the surface of the device. Since the metal electrode functions as a light interceptor, it is typically formed so as to cover only the center portion of the main surface of the light emitting layer portion, so that the light can be extracted from the peripheral area having no electrode formed thereon.

In this case, reduction in the area of the metal electrode is advantageous in ensuring a larger light leakage area formed around the electrode, and in improving the light extraction efficiency. Although a number of efforts have been made to increase the amount of extractable light by effectively spreading current within the device based on various designs of the electrode shape, any of them could not exempt from increase in the electrode area, and fell in a dilemma that consequent reduction in the light leakage area undesirably limits the amount of light extraction. Another problem resides in that carrier concentration of the dopant, that is conductivity, is generally suppressed at a slightly lower level in order to optimize light emitting recombination of the carriers within the active layer, and this makes the current less likely to spread in the in-plane direction. This means undesirable concentration of current density into the area covered with the electrode, and reduction in substantial amount of extractable light from the light leakage area. A general method for solving this problem is to dispose a current spreading layer having a raised carrier concentration, and consequently having a low resistivity, between the cladding layer and electrode. On the other hand, another possible constitution relates to that a thick current spreading layer is disposed on the back side of the device so that the layer is used also as the substrate (while the current spreading layer in this case may be assumed as a conductive substrate, it is to be defined in the specification that the layer conceptually belongs to the current spreading layer in a broad sense). In most conventional cases, such current spreading layer has been formed by the metal organic vapor-phase epitaxy process (also occasionally referred to as the MOVPE process) together with the light emitting layer portion The current spreading layer provided in the light emitting device is generally designed so as to increase the thickness thereof to some extent in order to sufficiently spread the current in the in-plane direction, and typically formed with a larger thickness than the light emitting layer portion has. The MOVPE process, however, is slow in the layer growth rate, needs considerably long time for growing the current spreading layer to a sufficient thickness, and thus raises problems in degraded production efficiency and increased costs. Organo-metallic compounds used as Group III element sources in the MOVPE process are generally expensive. Moreover, it is necessary in the MOVPE process to use Group V element sources (e.g., $AsH_3$, $PH_3$) in a great excess (10 to several hundred times) of Group III element sources in order to improve the crystallinity, and this raises another disadvantage from the viewpoint of costs The current spreading layers grown by the MOVPE process are likely to contain residual H (hydrogen) and C (carbon) derived from the organo-metallic molecules. For the case where the current spreading layer is designed to have a conductivity type of p-type by doping with Zn (zinc) or Mg (magnesium), the residual H in particular is known to bond with Zn or Mg (Zn in particular) to lower the acceptor activity, so that a relatively large amount of Zn or Mg must be added in order to ensure a sufficient conductivity required for the current spreading layer. Addition of Zn or Mg in a large amount will, however, raise the problems below.

The light emitting devices lower their luminance as the current supply thereto is prolonged. Assuming now that the emission luminance measured immediately after the start of current supply to the device at a constant current is defined as the initial luminance, and the emission luminance which decreases with the elapse of cumulative current supply time is traced. In this case, a time required for the emission luminance to reach a predetermined limit luminance, or a ratio of emission luminance after the elapse of evaluation current supply time with respect to the initial luminance (referred to as "device life", hereinafter) under a constant evaluation current supply time (e.g., 1,000 hours) can be used as a kind of index for evaluating the device life. Excessive increase in the Zn concentration in the current spreading layer, in particular in a portion adjacent to the light emitting layer portion, tends to accelerate the degradation of the device life.

Another problem is that the electrode in the light emitting device can act as a light interceptor, and application of a drive voltage to the electrode raises the in-device current density in a portion directly under the electrode or around, but lowers it in the circumferential area around the electrode from which the light is to be extracted. The light extraction efficiency is thus likely to degrade. In one possible countermeasure, a current blocking layer is formed as being buried in the current spreading layer directly under the electrode so as to allow the current to bypass in the current spreading layer out from the electrode formation area, to thereby successfully raise the light extraction efficiency. The formation of such current blocking layer inevitably increases the number of process steps, and further degrades the production efficiency.

Formation of the current blocking layer as being buried in the current spreading layer can raise another problem when the current spreading layer covering the current blocking layer Is formed by the MOVPE process or the LPE (liquid-phase epitaxy) process, since the resultant current spreading layer tends to have on the surface thereof a large step with a dulled shape of the underlain current blocking layer, while being associated with crystal defects. Such step and defects are causative of connection failure with the electrode, or degradation of efficiency and yield ratio of the wire bonding process since they may serve as a factor of detection error in the image processing for wire bonding to the electrode.

It is therefore a first subject of the invention to provide a method of fabricating a light emitting device capable of forming the current spreading layer in an efficient manner. A second subject resides In providing a light emitting device having an improved device life even if Zn or Mg is used as a p-type dopant. A third subject resides in a method of fabricating a light emitting device capable of forming a current spreading layer having a current blocking layer buried therein in an efficient manner, and of providing a light emitting device with an improved surface smoothness of the current spreading layer.

SUMMARY OF THE INVENTION

First Invention

To solve the first subject, a method of fabricating a light emitting device according to a first invention is such as fabricating a light emitting device in which a light emitting layer portion and a current spreading layer respectively composed of a Group III-V compound semiconductor, and an electrode for applying light emission drive voltage to the light emitting layer portion, are once stacked in this order on a single crystal substrate, and the method comprises:

a first vapor-phase growth step for forming the light emitting layer portion on the single crystal substrate by the metal organic vapor-phase epitaxy process;

a second vapor-phase growth step, carried out after the light emitting layer portion was formed, for forming the p-type current spreading layer based on the hydride vapor-phase epitaxy process; and a high-concentration doped layer forming step for forming a high-concentration doped layer in a surficial area including the main surface on the electrode forming side of the current spreading layer, so as to have a carrier concentration of p-type dopant higher than that in the residual portion of the current spreading layer.

A first constitution of a light emitting device of the first invention has a light emitting layer portion and a current spreading layer, respectively composed of a Group III-V compound semiconductor, once formed on a single crystal substrate by epitaxial growth, wherein:

the light emitting layer portion is such as being once formed on the single crystal substrate by epitaxial growth according to the metal organic vapor-phase epitaxy process;

the p-type current spreading layer is formed on the light emitting layer portion by the hydride vapor-phase epitaxy process; and a high-concentration doped layer is formed in a surficial area including the main surface on the electrode forming side of the current spreading layer, where the electrode being provided for applying light emission drive voltage to the light emitting layer portion, so as to have a carrier concentration of p-type dopant higher than that in the residual portion of the current spreading layer.

In the method of fabricating a light emitting device of the first Inventions the light emitting layer portion which is composed of a Group III-V compound semiconductor is formed by the metal organic vapor-phase epitaxy process (MOVPE process). On the other hand, the current spreading layer is formed by the hydride vapor phase epitaxy process (referred to as the HVPE process, hereinafter). The HVPE process refers to a method in which less volatile Ga (gallium) is converted into highly volatile GaCl through a reaction with hydrogen chloride, and a Group V element source gas and Ga in a form of GaCl are reacted to allow the Group III-V compound semiconductor layer to grow in the vapor phase. Whereas the layer growth rate in the MOVPE process Is approx. 4 $\mu$m/hour, that in the HVPE process is as fast as approx 9 $\mu$m/hour That is, adoption of the HVPE process is successful in obtaining a higher layer growth rate than by the MOVPE process, and even a current spreading layer having a certain level of thickness can be formed very efficiently, so that costs for the source materials can be suppressed by far than in the MOVPE process. The HVPE process is also advantageous from the viewpoint of costs since expensive organo-metallic compounds are not necessary as the Group III element sources, and the Group V element sources (e.g., $AsH_3$, $PH_3$) are necessary only in a mixing ratio to the Group III element sources far smaller than ever (typically ⅓ times or around).

In particular, use of $GaAs_{1-a}P_a$ ($0 \leq a \leq 1$) as a material composing the current spreading layer is advantageous in that the material can readily be grown by the HVPE process, and that it becomes more easier to upgrade quality of the current spreading layer It is to be noted that $GaAs_{1-a}P_a$ ($0 \leq a \leq 1$) in the invention conceptually includes GaP, because GaP alloy composition "a" may have a value of 1. On the other hand, it conceptually includes also GaAs because GaP alloy composition "a" may have a value of 0, where GaAs has a band gap smaller than that of GaP, and is more likely to cause absorption of flux of light emitted from the light emitting portion 24. It is therefore preferable to set GaP alloy composition "a" larger than 0 (the same will apply also to a second invention, third invention and fourth invention as described later).

In the first invention, a high-concentration doped layer is formed in a surficial area including the main surface on the electrode forming side of the current spreading layer, so as to have a carrier concentration of p-type dopant higher than that in the residual portion of the current spreading layer. By forming such high-concentration doped layer, in-plane spreading effect of the current in the surficial portion of the current spreading layer is improved, and this ensures a sufficient current spreading effect even under a small layer thickness. The concentration of the p-type dopant is not raised over the entire portion of the layer, but instead selectively raised only in a surficial portion, and this is less likely to cause degradation in the device life otherwise possibly caused by an excessive dopant concentration. The H concentration of the current spreading layer formed by the HVPE process can typically be suppressed to as low as $7 \times 10^{17}/cm^3$ or lower, and it is even relatively easy to reduce it below the detection limit (e.g., approx $1 \times 10^{17}/cm^3$ or lower). In particular in the area other than the high-concentration doped layer, the concentration of the p-type dopant par se can be suppressed to a low level by virtue of such low H concentration, and this also contributes to longer device life. In particular for the case where the current spreading layer is formed as thin as 20 $\mu$m or less, provision of the high-concentration doped layer takes a large effect.

Since the current spreading layer is formed by the HVPE process in the first invention, the high-concentration doped layer can be formed efficiently by the procedures below.

That is, in the second vapor-phase growth step, the current spreading layer is formed by supplying a dopant gas together with a source gas for the Group III-V compound semiconductor; and after the second vapor-phase growth step, the dopant is additionally diffused from the surficial portion of the current spreading layer to thereby form the high-concentration doped layer. Also the additional diffusion can be carried out by the vapor-phase diffusion using the dopant gas. By such procedure, the growth of the current spreading layer based on the HVPE process and the additional diffusion for forming the high-concentration doped layer can readily be carried out in a successive manner by vapor-phase diffusion such as vacuum diffusion.

An advantage of forming the high-concentration doped layer becomes particularly eminent when the current spreading layer is composed of p-type $GaAs_{1-a}P_a$ ($0 \leq a \leq 1$) using at least either of Zn and Mg as the dopant. That is, since the current spreading layer is grown by the HVPE process in the first invention, only a small amount of Zn or Mg (Zn in particular) is inactivated through bonding with H, so that the amount of addition of Zn or Mg can be reduced all along. This successfully ensures a large concentration margin of Zn or Mg under the limit concentration causative of degradation of the device life, and intrinsically reduces influences of the formation of the high-concentration doped layer on the device life or so. It is to be noted now that Zn diffuses faster than Mg in $GaAs_{1-a}P_a$. It is therefore more efficient to select Zn for the case where the high-concentration doped layer is formed by the additional diffusion, since a necessary thickness of the high-concentration doped layer can be formed within a shorter time. Setting of the dopant concentration of the current spreading layer lower than that of the p-type cladding layer is further more advantageous in suppressing degradation of the device life. Since the current spreading layer composed of a p-type $GaAs_{1-a}P_a$ ($0 \leq a \leq 1$) layer containing at least either of Zn and Mg as the dopant improves the light extraction efficiency by suppressing the light absorption, it is preferable to select GaP alloy composition "a" so that the band gap energy thereof is larger than an optical energy corresponded to the peak emission wavelength of the light emitting layer portion.

Because the current spreading layer is grown by the HVPE process by which a large growth speed is attainable in the first invention (second, third and fourth invention described later also included), even the current spreading layer having a thickness of 20 μm or above, which is difficult to grow within a practical duration of time by the MOVPE process, can be obtained in a relatively efficient manner. In particular, the current spreading layer grown to as thick as 50 μm or above can be used also as the substrate of the device. In this case, the current spreading layer available also as the substrate of the device may be disposed on either of the light extraction side of the light emitting layer portion (where only a part of the main surface of the current spreading layer Is covered with the electrode) or the back side.

For the case where the current spreading layer is disposed on the back side, the contact layer is formed so as to partially cover the back side of the current spreading layer having transparency to the light emitted from the light emitting layer portion. It is also allowable, on the back side of the current spreading layer, to cover the contact layer with a metal electrode which is also used as a reflective layer so as to cover the contact layer together with the area having no contact layer formed therein. In this case, the contact layer contributes to lower the contact resistance between the metal electrode and the current spreading layer. On the other hand, it is still also allowable, on the back side of the current spreading layer, to cover the contact layer with a metal paste layer such as an Ag paste layer together with the area having no contact layer formed therein. In either case, reflective effect of flux of light can be raised by the metal electrode or metal paste layer in particular in the area having no contact layer formed therein (the same will apply also to the second, third and fourth inventions described later).

It is to be noted that the current spreading layer having a thickness exceeding 200 μm may considerably extend the duration of time for the growth even with the HVPE process, and may ruin the production efficiency. From this point of view, the thickness of the current spreading layer (formed in the second vapor-phase growth step) is preferably set to 200 μm or below. Too thin current spreading layer may, however, be unsuccessful in achieving a sufficient current spreading effect to thereby ruin the emission efficiency. It is therefore preferable for the current spreading layer to ensure at least 5 μm of the thickness. For the case where the current spreading layer is not used as the substrate of the device, the thickness thereof is preferably limited to less than 50 μm while placing a priority to the production efficiency. In particular for the case where the growth temperature is relatively high (e.g., 800° C. or above), the thickness of the current spreading layer is preferably set to less than 50 μm, and more preferably to 20 μm or below, since no further increase in the emission intensity is expectable even if the thickness of the current spreading layer increases to or beyond 50 μm. On the other hand, as described later in the fourth invention, selection of an optimum off-angled, single crystal substrate on which the growth proceeds can considerably lower the growth temperature of the current spreading layer in the HVPE process. In this case, increase in the thickness of the current spreading layer may be successful in further increasing the emission intensity, and selection of the thickness of 50 μm or above may be valuable.

When at least either of Zn and Mg is used as the p-type dopant of the current spreading layer, the carrier concentration of the p-type dopant in the high-concentration doped layer preferably falls within a range from $2 \times 10^{18}/cm^3$ to $5 \times 10^{19}/cm^3$. The carrier concentration of at least either of Zn and Mg less than $2 \times 10^{18}/cm^3$ may be less effective in promotion of in-plane current spreading in the high-concentration doped layer, and exceeding $5 \times 10^{19}/cm^3$ may ruin the crystallinity due to alloying. The thickness of the high-concentration doped layer is preferably adjusted within a range from 1 μm to 4 μm. The thickness less than 1 μm may be less effective In promotion of in-plane current spreading, and exceeding 4 μm may degrade the device life or emission intensity since ratio of the thickness of the high-concentration doped layer to the total thickness becomes too large.

On the other hand, the carrier concentration of at least either of Zn and Mg of the p-type dopant of the current spreading layer but in a portion other than the high-concentration doped layer preferably falls within a range from $1 \times 10^{17}/cm^3$ to $2 \times 10^{18}/cm^3$. The carrier concentration of at least either of Zn and Mg less than $1 \times 10^{17}/cm^3$ may increase series resistance of such portion to thereby lower the emission efficiency. On the other hand, the carrier concentration exceeding $2 \times 10^{18}/cm^3$ may result in diffusion of at least either of Zn and Mg in a large amount from such portion towards the light emitting layer portion, to thereby degrade the emission performance (the effect more apparently shown by Zn).

The current spreading layer composed of GaP, having a relatively wide band gap, is less likely to cause light absorption even when a short-wavelength light is emitted from the light emitting layer portion. Such constitution is advantageous in view of ensuring a necessary light extraction efficiency, and of widening a selectable range of materials for the light emitting layer portion when suppression of light absorption is taken into account.

When the current spreading layer is designed to have a portion on the electrode forming side a high-GaAs-alloy-composition $GaAs_{1-a}P_a$ ($0 \leq a \leq 1$) layer having a GaAs alloy composition 1-a larger than that in the residual portion, and to have the high-concentration doped layer, containing Zn as the dopant, formed in the high-GaAs-alloy-composition $GaAs_{1-a}P_a$ layer, the Zn diffusion rate in the high-Gas-alloy-composition $GaAs_{1-a}P_a$ layer can be raised, and the high-concentration doped layer thus can be formed more efficiently. For example, even if the essential portion of the current spreading layer is composed of GaP, provision of a GaAsP layer only in the surficial portion thereof can successfully allow the high-concentration doped layer to be formed in a short period by the additional diffusion of Zn. The high-GaAs-alloy-composition $GaAs_{1-a}P_a$ layer is preferably formed in a thickness slightly larger (by 0.5 μm to 2 μm or around) than that of the high-concentration doped layer. For example, for the case where the high-concentration doped layer is formed in a thickness of 1 μm to 4 μm, the high-GaAs-alloy-composition $GaAs_{1-a}P_a$ layer is preferably formed in a thickness of 2 μm to 5 μm.

In the first invention, the current spreading layer is not precluded from forming the entire portion thereof by the HVPE process. However for the case where the current spreading layer and a portion of the light emitting layer portion in contact with the current spreading layer are composed of Group III-V compound semiconductors differing from each other in the lattice constants, and the difference between the lattice constants is large to a certain extent, formation of the current spreading layer directly on the light emitting layer portion by the HVPE process may degrade the crystallinity of the current spreading layer and may consequently degrade the emission performance. In one solution for the problem, the current spreading layer has an MO layer portion formed by the metal organic vapor-phase epitaxy process in a portion in contact with the light emitting layer portion, and has an HVPE layer portion formed by the hydride vapor-phase epitaxy process in the residual portion. This solution is successful in improving the crystallinity of the current spreading layer, and in obtaining the light emitting device having an excellent emission performance.

In the light emitting device of the first invention, the current blocking layer, which comprises a Group III-V compound semiconductor having a conductivity type different from that of the current spreading layer, can be formed as being buried in the current spreading layer. Since the electrode can act as a light interceptor, application of a drive voltage to the electrode raises the in-device current density in a portion directly under the electrode or around, but lowers it in the circumferential area around the electrode from which the light is to be extracted. The light extraction efficiency is thus likely to degrade. The light extraction efficiency can however be raised if the aforementioned current blocking layer is formed as buried in the current spreading layer directly under the electrode, since the current blocking layer allows the current to bypass in the current spreading layer out from the electrode formation area. It is to be defined now that the current blocking layer in the context of this specification does not belong to the current spreading layer.

In this case, a current blocking layer forming step for forming the current blocking layer as being buried is necessary. In the first invention, at least a portion of the current spreading layer covering the current blocking layer on the electrode forming side is formed in the second vapor-phase growth step (that is, by HVPE process). If the current spreading layer covering the current blocking layer is formed by the MOVPE process or the LPE process, as typically shown in FIG. 7B, the resultant current spreading layer tends to have on the surface thereof a large step with a dulled shape of the underlain current blocking layer, while being associated with crystal defects. Such step and defects are causative of connection failure with the electrode, or degradation of efficiency and yield ratio of the wire bonding process since they may serve as a factor of detection error in the image processing for wire bonding to the electrode. On the contrary, formation of the portion of the current spreading layer portion covering the current blocking layer by the HVPE process hardly produces such step and crystal defects, and instead the current spreading layer having a smooth surface can be formed as shown in FIG. 7A, and is less causative of the above-described nonconformities.

The current blocking layer forming step can specifically be carried out as including the process steps described below:

1. a third-vapor-phase growth process: in this step, a first layer which composes a part of the current spreading layer and is composed of a first-conductivity-type Group III-V compound semiconductor, and a second layer which composes the current blocking layer and is composed of a second-conductivity-type Group III-V compound semiconductor, are sequentially formed on the light emitting layer portion by the MOVPE process; and 2. etching step: in this step, an unnecessary portion of thus-obtained second-conductivity-type compound semiconductor layer is removed so as to leave a portion to be the current blocking layer Moreover in the second vapor-phase growth step, a third layer which comprises a Group III-V compound semiconductor having a conductivity type same as that of the first layer, is formed so as to cover a portion of the second layer left unetched, by the hydride vapor-phase epitaxy (HVPE) process.

The first layer composes a portion of the current spreading layer, which serves as a base for the current blocking layer, and the second layer composes the current blocking layer. According to the above method, the third vapor-phase growth process for forming the first and second layers can be carried out in succession to the first vapor-phase growth process for forming the light emitting layer portion by the same MOVPE process, in a highly efficient manner. An especially large effect can be obtained when the first vapor-phase growth step and third vapor-phase growth step are successively carried out within the same growth chamber without taking the substrate out from such chamber.

In this case, after completion of the third vapor-phase growth step, the substrate must be taken out from the growth chamber, and transferred into another chamber in which the second vapor-phase growth step based on the HVPE process is to be proceeded During the transfer, the first layer and second layer may adversely be affected by oxidation since they are exposed to an environment outside the chamber. It is also necessary to consider oxidation possibly occurs during etching if the second layer is to be chemically etched as described later. From this point of view, it is preferable to compose the first layer and second layer with a Group III-V compound semiconductor containing no Al (aluminum) which is a highly oxidizable element. More specifically, all of the first layer, second layer and third layer can preferably be composed of $GaAs_{1-a}P_a$ ($0 \leq a \leq 1$: having a band gap energy larger than an optical energy corresponded to the peak emission wavelength of the light emitting layer portion) This is because $GaAs_{1-a}P_a$ ($0 \leq a \leq 1$) can be grown most rapidly with an excellent quality when the third layer is formed by the HVPE process, and because the same material is also adopted to the second layer for convenience, which is however to be formed by the MOVPE process. Furthermore, by adopting the same $GaAs_{1-a}P_a$ ($0 \leq a \leq 1$: having a band gap energy larger than an optical energy corresponded to the peak emission wavelength of the light emitting layer portion) again to the first layer, it is no more necessary to change the source gas when formation of the first layer based on the MOVPE process finishes and the process then advances to formation of the second layer in the third vapor-phase growth step, and this facilitates the fabrication. This is also advantageous in avoiding unnecessary band-edge discontinuity, so that there is no need to anticipate degradation of the emission performance.

It is to be noted that the second layer and first layer are composed of same $GaAs_{1-a}P_a$ ($0 \leq a \leq 1$) but opposite in the conductivity type. For example, if the third layer is composed of a p-type $GaAs_{1-a}P_a$ ($0 \leq a \leq 1$: having a band gap energy larger than an optical energy corresponded to the peak emission wavelength of the light emitting layer portion) containing at least either of Zn and Mg as the dopant, the second layer can be composed of an n-type $GaAs_{1-a}P_a$ ($0 \leq a \leq 1$: having a band gap energy larger than an optical energy corresponded to the peak emission wavelength of the light emitting layer portion) containing Si (silicon) or the like as the dopant. In the current spreading layer for this case, it is also allowable to use different kinds of dopants for the first layer to be formed by the MOVPE process and the third layer to be formed by the HVPE process. For a typical case where Zn is used as the dopant for the third layer, the dopant for the first layer may be Zn, or may be Mg in place of Zn.

Selection of Mg as the dopant for the first layer composed of $GaAs_{1-a}P_a$ ($0 \leq a \leq 1$) is advantageous in suppressing nonconformities such as degradation in the emission performance, because Mg shows only a small diffusion rate in $GaAs_{1-a}P_a$, and Mg contained in the first layer is less likely to cause reverse diffusion back to the light emitting layer portion. From the viewpoint of raising current spreading effect, it is further advantageous to form the high-concentration doped layer to the third layer in contact with the first layer. For the case where the high-concentration doped layer is formed by the additional diffusion of Zn, nonconformities such that Zn diffused from the high-concentration doped layer adversely affects the light emitting layer portion through the third layer can effectively be suppressed, if the dopant concentration in a portion of the third layer other than the high-concentration doped layer, that is, a portion in contact with the first layer, is adjusted to as low enough as $1 \times 10^{17}/cm^3$ to $5 \times 10^{18}/cm^3$, both ends inclusive.

For the next etching step in the first invention, the second layer can be etched by a chemical etching using an etching solution in a simple and efficient manner, while vapor-phase etching is also allowable. It is preferable in the chemical etching to use an etching solution exhibiting a higher etching activity to the second layer than to the first layer, and being capable of selectively etching the second layer. It is, however, not easy to find an etching solution exhibiting a distinct difference in the etching activities between the first and second layers when both of these layers are composed of a compound semiconductor material of same species. In an exemplary case where the etching solution exhibiting only a small difference in the etching activities is unwillingly used for the etching, also the first layer is heavily affected by the etching due to lack of the etching selectivity.

In this case, it is effective to form, between the first layer and the second layer, a fourth layer composed of a Group III-V compound semiconductor different from those composing both layers, and to selectively remove the second layer in the next etching step using the fourth layer as an etch stop layer. That is, by forming the fourth layer composed of a material different from that of the second layer as an underlying layer thereof an etching solution having a suitable etching property for the second layer can readily be found even for the case where a suitable etching solution cannot be found for the first and second layers composed of the same material. By using such suitable etching solution as a first etching solution, the second layer can readily be etched in a selective manner while using the fourth layer as the etch stop layer in the etching step. While the fourth layer remains unetched directly below second layer only in a portion to be left as the current blocking layer, the residual portion of the fourth layer by no means affects the emission characteristics or the like since the residual portion occurs only in a portion where the current is blocked by the current blocking layer.

The fourth layer is preferably composed of an Al-free, Group III-V compound semiconductor. If Al is contained in the fourth layer used as the etch stop layer in the selective etching of the second layer using the first etching solution, the etching solution may react with Al to undesirably produce an insulating Al oxide layer. Then another disadvantage may arise that thus-produced Al oxide layer may interfere etching for forming the third layer, when the third layer is to be formed by removing the exposed portion of the fourth layer using a second etching solution as described later. On the other hand, if the third layer is formed while leaving the fourth layer unetched, series resistance may increase by the Al oxide layer, and epitaxial growth of the third layer onto the fourth layer may be inhibited. Both cases may result in degraded emission characteristics.

For example, for the case where the second layer is composed of $Al_dGa_{1-d}P$ ($0<d\leq 1$) or $(Al_dGa_{1-b})_cIn_{1-c}P$ ($0<b\leq 1$; $0 \leq c \leq 0.5$), selection of $GaAs_{1-a}P_a$ ($0 \leq a \leq 1$) for the first layer and hydrochloric acid as the etching solution for the second layer will be successful in etching the second layer while keeping a desirable selectivity over the first layer even if the fourth layer is not specifically provided. However for the case where oxidation of Al contained In the second layer may be anticipated, also the second layer is preferably composed of $GaAs_{1-a}P_a$ ($0 \leq a \leq 1$). This, however, makes it more difficult to selectively etch the second layer by the chemical etching, and therefore it is advantageous to insert the fourth layer composed of $GaAs_{1-b}P_b$ ($a \leq b \leq 1$) having a larger GaP alloy composition than that of the second layer from the viewpoint of ensuring an excellent etching selectivity between the second and fourth layers. In particular for the case where the second and first layers are composed of $GaAs_{1-a}P_a$ ($0.5 \leq a \leq 0.9$) and the fourth layer is composed of GaP, the fourth layer can exhibit an excellent etch stop effect. A typical example of the first etching solution available herein is sulfuric acid or a mixed solution of sulfuric acid and hydrogen peroxide, with which the selective etching of the second layer while using the fourth layer as the etch stop layer can be proceeded in an effective manner.

The thickness of the fourth layer is preferably adjusted within a range from 1 nm to 100 nm. The thickness of less than 1 nm may be unsuccessful in obtaining a sufficient etch stop effect, and exceeding 100 nm may be uneconomic since the etch stop effect saturates.

One possible process is such that the outer portion of the second layer is selectively removed by the chemical etching using the first etching solution while using the fourth layer as the etch stop layer, then the fourth layer exposed out from the second layer is selectively removed by the chemical etching using the second etching solution while using the first layer as the etch stop layer to thereby expose the first layer, and the third layer can be grown so as to come into contact with the outer portion of the first layer in the second vapor-phase growth step. According to this process, unnecessary fourth layer does not remain between the first and third layers which compose the current spreading layer, around the second layer remained as the current blocking layer, and thus a problem of undesirable light absorption possibly ascribable to the fourth layer is less likely to occur. It is also allowable to form the third layer while leaving the fourth layer exposed out from the second layer unetched if the thickness of the fourth layer is adjusted within a small range from 1 nm to 50 nm, since such thin fourth layer can almost exclude influences of the light absorption.

The light emitting layer portion can be composed as having a double heterostructure in which a first-conductivity-type cladding layer, an active layer and a second-conductivity-type cladding layer, where all of which are composed of $(Al_xGa_{1-x})_yIn_{1-y}P$ (where, $0 \leq x \leq 1$ and $0 \leq y \leq 1$), are stacked in this order as viewed from the electrode side, where the electrode provided for applying light emission drive voltage to the light emitting layer portion. By virtue of energy barriers ascribable to difference of band gaps between the active layer and cladding layer on both sides thereof, holes and electrons injected into the active layer are well confined within a narrow active layer and allowed to efficiently recombine, and this ensures an excellent emission efficiency. In addition, compositional adjustment of the active layer can further expand a possible range of emission wavelength. The effect of the first invention is most distinctively exhibited when the current spreading layer is composed of a p-type layer containing at least either of Zn and Mg is used as the dopant, where the first-conductivity-type cladding layer herein is composed of p-type $(Al_xGa_{1-x})_yIn_{1-y}P$.

Next, a second constitution of a light emitting device of the first invention has a light emitting layer portion and a current spreading layer, respectively composed of a Group III-V compound semiconductor, once formed on a single crystal substrate by epitaxial growth, wherein:

the light emitting layer portion has a double heterostructure in which a p-typ cladding layer, an active layer and an n-type cladding layer, all of which being composed of $(Al_xGa_{1-x})_yIn_{1-y}P$ (where, $0 \leq x \leq 1$ and $0 \leq y \leq 1$), are stacked in this order as viewed from the electrode side, where the electrode being provided for applying light emission drive voltage to the light emitting layer portion, and the p-type cladding layer is composed of p-type $(Al_xGa_{1-x})_yIn_{1-y}P$ using Zn as the dopant;

the current spreading layer is formed, using at least either of Zn and Mg as the dopant, as a p-type $GaAs_{1-a}P_a$ ($0 \leq a \leq 1$) layer having a band gap energy larger than an optical energy corresponded to the peak emission wavelength of the light emitting layer portion;

the current spreading layer has an H concentration lower than that of the p-type cladding layer; and a high-concentration doped layer is formed in a surficial area including the main surface on the electrode forming side of the current spreading layer, so as to have a carrier concentration of at least either of Zn and Mg higher than that in the residual portion of the current spreading layer.

As for light emitting devices in which the light emitting layer portions are composed with an $(Al_xGa_{1-x})_yIn_{1-y}P$ double heterostructure, it is most general to define the p-type cladding layer side as the light extraction side, and to provide the current spreading layer on this side, because emission recombination is more likely to occur on the p-type cladding layer side considering difference in the mobility of holes and electrons. The current spreading layer, which has conventionally been formed by the MOVPE process, contains a large amount of residual H and C, so that when the layer is to be formed as a p-type layer using at least either of Zn and Mg as the dopant, the concentration of at least either of Zn and Mg must be set considerably higher than that in the p-type cladding layer in order to compensate a portion of the dopant possibly inactivated through bonding with the residual H. Nonconformities of shortened device life caused by such excessive dopant concentration are as described elsewhere in the above.

In the second constitution of a light emitting device of the first invention, the current spreading layer is composed of a p-type $GaAs_{1-a}P_a$ ($0 \leq a \leq 1$) layer containing at least either of Zn and Mg as the dopant, and the H concentration in the current spreading layer is set smaller than that in the p-type cladding layer. Such quantitative relation of the concentration can readily be attained by forming the current spreading layer by the HVPE process. As a consequence, a sufficient level of conductivity can be ensured even when the concentration of at least either of Zn and Mg in the current spreading layer is set lower than that in the p-type cladding layer, because only a small amount of at least either of Zn and Mg can be inactivated through bonding with H. Thus lowered concentration of at least either of Zn and Mg can successfully improve the device life Effects of the formation of the high-concentration doped layer are absolutely same as described in the first constitution.

When the light emitting layer portion is composed of $(Al_xGa_{1-x})_yIn_{1-y}P$ (where, $0 \leq x \leq 1$ and $0 < y \leq 1$) as described in the above, it is preferable to form the current spreading layer as a $GaAs_{1-a}P_a$ ($0 \leq a \leq 1$; having a band gap energy larger than an optical energy corresponded to the peak emission wavelength of the light emitting layer portion) layer, to form a portion of the current spreading layer in contact with the light emitting layer portion by the metal organic vapor-phase epitaxy process, and to form the residual portion by the hydride vapor-phase epitaxy (HVPE) process. More specifically, it is preferable to form the current spreading layer as a $GaAs_{1-a}P_a$ ($0 \leq a \leq 1$; having a band gap energy larger than an optical energy corresponded to the peak emission wavelength of the light emitting layer portion) layer, to form a portion of the current spreading layer in contact with the light emitting layer portion as an MO layer portion grown by the metal organic vapor-phase epitaxy process, and to form the residual portion as an HVPE layer portion grown by the hydride vapor-phase epitaxy (HVPE) process. Although $(Al_xGa_{1-x})_yIn_{1-y}P$ composing the light emitting layer portion and $GaAs_{1-a}P_a$ ($0 \leq a \leq 1$) composing the current spreading layer are likely to largely differ from each other in the lattice constants, the crystallinity of the current spreading layer can be improved by first forming the portion of the current spreading layer in contact with the light emitting layer portion by the metal organic vapor-phase epitaxy process, and then by forming the residual portion of the current spreading layer by the HVPE process, as described in the above.

Second Invention

To solve the third subject, a method of fabricating a light emitting device according to a second invention is such as fabricating a light emitting device having a light emitting layer portion and a current spreading layer respectively composed of a Group III-V compound semiconductor, and an electrode for applying light emission drive voltage to the light emitting layer portion, stacked in this order on a single crystal substrate, the method comprises:

a first vapor-phase growth step for forming the light emitting layer portion on the single crystal substrate by the metal organic vapor-phase epitaxy process;

a second vapor-phase growth step, carried out after the light emitting layer portion was formed, for forming the current spreading layer based on the hydride vapor-phase epitaxy process: and a current blocking layer forming step for forming a current blocking layer which comprises a Group III-V compound semiconductor having a conductivity type different from that of the current spreading layer, as being buried in the current spreading layer; wherein at least a portion of the current spreading layer covering the current blocking layer on the electrode side is formed by the hydride vapor-phase epitaxy process.

Also in the method of fabricating a light emitting device of the second invention, similarly to as described in the first invention, the light emitting layer portion composed of a Group III-V compound semiconductor is grown by the metal organic vapor-phase epitaxy (MOVPE) process, and on thus-grown, light emitting layer portion, the current spreading layer composed of a Group III-V compound semiconductor is formed by the hydride vapor-phase epitaxy (HVPE) process. At least a portion of the current spreading layer covering the current blocking layer on the electrode side is formed in the second vapor-phase growth step (i.e., by the HVPE process).

The light emitting layer portion can be formed so as to have a double heterostructure in which a first-conductivity-type cladding layer, an active layer and a second-conductivity-type cladding layer, all of which being composed of $(Al_xGa_{1-x})_yIn_{1-y}P$ (where, $0 \leq x \leq 1$ and $0 \leq y \leq 1$), are stacked in this order as viewed from the electrode side, where the electrode is provided for applying light emission drive voltage to the light emitting layer portion.

To form the current blocking layer as being buried in the current spreading layer, the current blocking layer after grown is etched according to a predetermined pattern, and has to be transferred into another chamber in which the second vapor-phase growth step based on the HVPE process is to be proceeded. During the transfer, the current blocking layer may adversely be affected by oxidation since the layer is exposed to an environment outside the chamber. It is also necessary to consider oxidation possibly occurs during etching if the current blocking layer is to be chemically etched as described later. Composing now the current blocking layer with a Group III-V compound semiconductor containing no Al (aluminum), which is a highly oxidizable element, is preferable in view of preventing the problem in oxidation.

The Al-free current spreading layer can be composed of GaP. By virtue of its relatively wide band gap, GaP is less likely to cause light absorption even when a short-wavelength light is emitted from the light emitting layer portion. Such constitution is advantageous in view of ensuring a necessary light extraction efficiency, and of widening a selectable range of materials for the light emitting layer portion when suppression of light absorption is taken into account.

On the other hand, composing the current spreading layer with $GaAs_{1-a}P_a$, which is an alloy of Gap and GaAs, yields the following advantages. That is, when the high-concentration doped layer is formed in the surficial portion on the electrode forming side of the current spreading layer by additional diffusion of Zn, a necessary thickness of the high-concentration doped layer can be formed in a short time since Zn exhibits a higher diffusion rate in $GaAs_{1-a}P_a$ than in GaP. When $GaAs_{1-a}P_a$ is used for this purpose, GaP is preferably selected so as to have an alloy composition "a" within a range from 0.5 to 0.9. The GaP alloy composition "a" of less than 0.5 relatively raises the GaAs alloy composition, and may undesirably narrow the band gap to thereby make the light absorption more likely to occur On the contrary, the GaP alloy composition "a" exceeding 0.9 may relatively reduce the GaAs alloy composition, and may result in only a limited promotion effect of Zn diffusion.

The current blocking layer forming step can specifically be carried out as including the following process steps, similarly to as described in the first invention:

1. a third-vapor-phase growth process: in this step, a first layer which composes a part of the current spreading layer and is composed of a first-conductivity-type Group III-V compound semiconductor, and a second layer which composes the current blocking layer and is composed of a second-conductivity-type Group III-V compound semiconductor, are sequentially formed on the light emitting layer portion by the MOVPE process; and 2. etching step: in this step, an unnecessary portion of thus-obtained second-conductivity-type compound semiconductor layer is removed so as to leave a portion to be the current blocking layer.

Moreover in the second vapor-phase growth step, a third layer which comprises a Group III-V compound semiconductor having a conductivity type same as that of the first layer, is formed so as to cover a portion of the second layer left unetched, by the hydride vapor-phase epitaxy (HVPE) process.

The first vapor-phase growth step and the third vapor-phase growth step can successively be carried within the same growth chamber without taking the substrate out from the chamber Both of the first layer and second layer can be composed of a Group III-V compound semiconductor containing no Al (aluminum) which is a highly oxidizable element. More specifically, all of the first, second and third layers can be composed of $GaAs_{1-a}P_a$ ($0 \leq a \leq 1$; having a band gap energy larger than an optical energy corresponded to the peak emission wavelength of the light emitting layer portion). It is also preferable that the GaP alloy composition "a" is set to a same value for all of these layers.

It is to be noted that the second layer and first layer are composed of same $GaAs_{1-a}P_a$ ($0 \leq a \leq 1$) but opposite in the conductivity type. For example, if the third layer is composed of a p-type $GaAs_{1-a}P_a$ ($0 \leq a \leq 1$: having a band gap energy larger than an optical energy corresponded to the peak emission wavelength of the light emitting layer portion) containing at least either of Zn and Mg as the dopant, the second layer can be composed of an n-type $GaAs_{1-a}P_a$ ($0 \leq a \leq 1$) containing Si (silicon) or the like as the dopant. In the current spreading layer for this case, it is also allowable to use different kinds of dopants for the first layer to be formed by the MOVPE process and the third layer to be formed by the HVPE process. For a typical case where Zn is used as the dopant for the third layer, the dopant for the first layer may be Zn, or may be Mg in place of Zn Selection of Mg as the dopant for the first layer composed of GaAs$_{1-}$ $_aP_a$ ($0 \leq a \leq 1$) is advantageous in suppressing nonconformities such as degradation in the emission performance, because Mg shows only a small diffusion rate in $GaAs_{1-a}P_a$, and Mg contained in the first layer is less likely to cause reverse diffusion back to the light emitting layer portion.

For the next etching step in the second invention, the second layer can preferably be etched by a chemical etching using an etching solution in a simple and efficient manner, similarly to as described in the first invention. In this case, it is effective to form, between the first layer and the second layer, a fourth layer composed of a Group III-V compound semiconductor different from those composing both layers, and to selectively remove the second layer in the next etching step using the first etching solution while using the fourth layer as an etch stop layer. The fourth layer is preferably composed of an Al-free Group III-V compound semiconductor For example, for the case where the second layer is composed of $Al_dGa_{1-d}P$ ($0<d \leq 1$) or $(Al_bGa_{1-b})_cIn_{1-c}P$ ($0<b \leq 1$; $0 \leq c \leq 0.5$), selection of $GaAs_{1-a}P_a$ ($0 \leq a \leq 1$) for the first layer and hydrochloric acid as the etching solution for the second layer will be successful in etching the second layer while keeping a desirable selectivity over the first layer even if the fourth layer is not specifically provided. However for the case where oxidation of Al contained in the second layer may be anticipated, also the second layer is preferably composed of $GaAs_{1-a}P_a$ ($0 \leq a \leq 1$). In this case, it is advantageous to insert the fourth layer composed of $GaAs_{1-b}P_b$ ($a \leq b \leq 1$) having a larger GaP alloy composition than that of the second layer from the viewpoint of ensuring an excellent etching selectivity between the second and fourth layers. In particular for the case where the second and first layers are composed of $GaAs_{1-a}P_a$ ($0.5 \leq a \leq 0.9$) and the fourth layer is composed of GaP, the fourth layer can exhibit an excellent etch stop effect. A typical example of the first etching solution available herein is sulfuric acid or a mixed solution of sulfuric acid and hydrogen peroxide. The thickness of the fourth layer is preferably adjusted within a range from 1 nm to 100 nm.

One possible process is such that the outer portion of the second layer is selectively removed by the chemical etching using the first etching solution while using the fourth layer as the etch stop layer, then the fourth layer exposed out from the second layer is selectively removed by the chemical etching using the second etching solution while using the first layer as the etch stop layer to thereby expose the first layer, and the third layer can be grown so as to come into contact with the outer portion of the first layer in the second vapor-phase growth step. It is also allowable to form the third layer while leaving the fourth layer exposed out from the second layer unetched if the thickness of the fourth layer is adjusted within a small range from 1 nm to 50 nm.

Third Invention

To solve the first subject, a method of fabricating a light emitting device according to a third invention is such as fabricating a light emitting device in which a light emitting layer portion and a current spreading layer respectively composed of a Group III-V compound semiconductor, and an electrode for applying light emission drive voltage to the light emitting layer portion, are once stacked in this order on a single crystal substrate, the method comprises:

a first vapor-phase growth step for forming the light emitting layer portion on the single crystal substrate by the metal organic vapor-phase epitaxy process; and a second vapor-phase growth step, carried out after the light emitting layer portion was formed, for forming the current spreading layer composed of $GaAs_{1-a}P_a$ ($0.5 \leq a \leq 0.9$) based on the hydride vapor-phase epitaxy process.

A first constitution of a light emitting device of the third invention has a light emitting layer portion and a current spreading layer, respectively composed of a Group III-V compound semiconductor, once formed on a single crystal substrate by epitaxial growth, wherein:

the light emitting layer portion is formed on the single crystal substrate by the metal organic vapor-phase epitaxy process; and the current spreading layer composed of $GaAs_{1-a}P_a$ ($0.5 \leq a \leq 0.9$) is formed on the light emitting layer portion by the hydride vapor-phase epitaxy process. The light emitting layer portion can be formed so as to have a double heterostructure in which a first-conductivity-type cladding layer, an active layer and a second-conductivity-type cladding layer, all of which being composed of $(Al_xGa_{1-x})_yIn_{1-y}P$ (where, $0 \leq x \leq 1$ and $0 \leq y \leq 1$), are stacked in this order as viewed from the electrode side, where the electrode is provided for applying light emission drive voltage to the light emitting layer portion.

In the third invention, the current spreading layer composed of $GaAs_{1-a}P_a$ is formed by the hydride vapor-phase epitaxy (HVPE) process. The GaP alloy composition "a" of $GaAs_{1-a}P_a$ is adjusted as $0.5 \leq a \leq 0.9$. The GaP alloy composition "a" of less than 0.5 relatively raises the GaAs alloy composition, and may undesirably narrow the band gap to thereby make the light absorption more likely to occur, on the contrary, the GaP alloy composition "a" exceeding 0.9 may relatively reduce the GaAs alloy composition, and may result in only a limited suppression effect of diffusion because the growth temperature during the growth by the HVPE process becomes higher. The GaP alloy composition "a" is properly adjusted depending on the emission wavelength of the light emitting layer portion so as to obtain a band gap not causative of light absorption by the current spreading layer.

Since the current spreading layer in the third invention is formed by the HVPE process, the layer is less causative of residual H or C unlike the layer formed by the MOVPE process Therefore, even when the current spreading layer is composed of a p-type $GaAs_{1-a}P_a$ ($0.5 \leq a \leq 0.9$) layer containing at least either of Zn and Mg as the dopant, at least either of thus-added Zn and Mg is almost unlikely to be reduced in the acceptor activity through bonding with the residual H. This means that the amount of addition of at least either of Zn and Mg required for ensuring a necessary level of conductivity can be minimized to a far smaller level as compared with that of the current spreading layer formed by the MOVPE process. Such reduction in the concentration of at least either of Zn and Mg consequently improves the device life to a large extent This effect is distinctive in particular for the case where Zn is used as the dopant. The H concentration of the current spreading layer formed by the HYPE process can typically be suppressed to as low as $7 \times 10^{17}/cm^3$ or lower, and it is even relatively easy to reduce it below the detection limit (e.g., approx. $1 \times 10^{17}/cm^3$ or lower). In other words, the H concentration in a portion of the current spreading layer formed by the HVPE process can be suppressed to $7 \times 10^{17}/cm^3$ or lower. As for the current spreading layer composed of a p-type $GaAs_{1-a}P_a$ ($0 \leq a \leq 1$) layer containing at least either of Zn and Mg as the dopant, it is preferable to select the GaP alloy composition "a" so that the band gap energy thereof is larger than an optical energy corresponded to the peak emission wavelength of the light emitting layer portion, in order to suppress the light absorption and to improve the light extraction efficiency.

The carrier concentration of at least either of Zn and Mg in the current spreading layer can typically be set within a range from $1\times10^{17}/cm^3$ to $5\times10^{17}/cm^3$. The carrier concentration of at least either of Zn and Mg less than $1\times10^{17}/cm^3$ may be unsuccessful in obtaining a sufficient conductivity and current spreading effect, and exceeding $5\times10^{19}/cm^3$ may ruin the crystallinity due to alloying. Zn and Mg can be used separately or in combination.

For the case where the thickness of the current spreading layer is set small, it is preferable to form a high-concentration doped layer in a surficial area including the main surface on the electrode forming side of the current spreading layer, so as to have a carrier concentration of the dopant for generating majority carriers (for an exemplary case of p-type current spreading layer, the concentration of p-type dopant such as above-described Zn or Mg) higher than that in the residual portion of the current spreading layer. By forming such high-concentration doped layer, in-plane spreading effect of the current in the surficial portion of the current spreading layer is improved, and this ensures a sufficient current spreading effect even under a small layer thickness. The concentration of the dopant is not raised over the entire portion of the layer, but instead selectively raised only in a surficial portion, and this is less likely to cause degradation in the device life otherwise possibly caused by an excessive dopant concentration (particularly for the case where Zn is used as the p-type dopant), and also less likely to cause scattering loss of light due to the majority carriers. In particular for the case where the current spreading layer is formed as thin as 20 $\mu$m or less, provision of the high-concentration doped layer takes a large effect.

Also in the third invention, similarly to the first and second inventions, the high-concentration doped layer can be formed by the procedures below. That is, in the second vapor-phase growth step, the current spreading layer is formed by supplying a dopant gas together with a source gas for the Group III-V compound semiconductor; and after the second vapor-phase growth step, the dopant is additionally diffused from the surficial portion of the current spreading layer to thereby form the high-concentration doped layer. Also the additional diffusion can be carried out by the vapor-phase diffusion using the dopant gas. Advantage of forming the high-concentration doped layer is particularly distinctive when the current spreading layer is composed of p-type $GaAs_{1-a}P_a$ ($0.5 \leq a \leq 0.9$) containing at least either of Zn and Mg as the dopant. For the case where the HVPE layer is formed in the current spreading layer by the HVPE process, the HVPE layer can be formed so that the dopant concentration thereof on the major surface side close to the light emitting layer portion is lower than that in the p-type cladding layer. More specifically, the carrier concentration of at least either of Zn and Mg in the current spreading layer is preferably adjusted within a range from $2\times10^{18}/cm^3$ to $5\times10^{19}/cm^3$ in the high-concentration doped layer On the other hand, the carrier concentration of at least either of Zn and Mg in the residual portion of the high-concentration doped layer is preferably adjusted within a range from $1\times10^{17}/cm^3$ to $2\times10^{18}/cm^3$.

For the case where the high-concentration doped layer is formed, the current spreading layer is composed of $GaAs_{1-a}P_a$, and this yields the following advantages. That is, when the high-concentration doped layer is formed by additional diffusion of Zn, a necessary thickness of the high-concentration doped layer can be formed in a short time since Zn exhibits a higher diffusion rate in $GaAs_{1-a}P_a$ than in GaP It is to be noted that the GaP alloy composition "a" exceeding 0.9 may relatively reduce the GaAs alloy composition, and may result in only a limited promotion effect of Zn diffusion.

Although the current spreading layer in the third invention is not precluded from forming the entire portion thereof by the HVPE process, it is preferable to form a portion thereof in contact with the light emitting layer portion as the MO layer portion by the metal organic vapor-phase epitaxy process, and to form the residual portion as the HVPE layer portion by the hydride vapor-phase epitaxy process.

Also in the light emitting device of the third invention, it is allowable to form the current blocking layer as being buried composed of a Group III-V compound semiconductor having a conductivity type different from that of the current spreading layer, in the middle position in the thickness-wise direction of the current spreading layer. In this case, at least a portion of the current spreading layer covering the current blocking layer on the electrode side can be formed in the second vapor-phase growth step (i.e., by the HVPE process).

The current blocking layer forming step can specifically be carried out as including the following process steps, similarly to as described in the first and second inventions;

1. a third-vapor-phase growth process: in this step, a first layer which composes a part of the current spreading layer and is composed of a first-conductivity-type Group III-V compound semiconductor, and a second layer which composes the current blocking layer and is composed of a second-conductivity-type Group III-V compound semiconductor, are sequentially formed on the light emitting layer portion by the MOVPE process; and 2. etching step: in this step, an unnecessary portion of thus-obtained second-conductivity-type compound semiconductor layer is removed so as to leave a portion to be the current blocking layer.

Moreover in the second vapor-phase growth step, a third layer which comprises a Group III-V compound semiconductor having a conductivity type same as that of the first layer, is formed so as to cover a portion of the second layer left unetched, by the hydride vapor-phase epitaxy (HVPE) process.

Both of the first layer and second layer can be composed of a Group III-V compound semiconductor containing no Al (aluminum) which is a highly oxidizable element. More specifically, all of the first, second and third layers can be composed of $GaAs_{1-a}P_a$ ($0.5 \leq a \leq 0.9$; having a band gap energy larger than an optical energy corresponded to the peak emission wavelength of the light emitting layer portion).

It is to be noted that the second layer and first layer are composed of same $GaAs_{1-a}P_a$ ($0.5 \leq a \leq 0.9$) but opposite in the conductivity type. For example, if the third layer is composed of a p-type $GaAs_{1-a}P_a$ ($0.5 \leq a \leq 0.9$) containing at least either of Zn and Mg as the dopant, the second layer can be composed of an n-type $GaAs_{1-a}P_a$ ($0.5 \leq a \leq 0.9$) layer containing Si (silicon) or the like as the dopant. In the current spreading layer for this case, it is also allowable to use different kinds of dopants for the first layer to be formed by the MOVPE process and the third layer to be formed by the HVPE process. For a typical case where Zn is used as the dopant for the third layer, the dopant for the first layer may be Zn, or may be Mg in place of Zn.

The dopant of the first layer composed of $GaAs_{1-a}P_a$ ($0.5 \leq a \leq 0.9$) may be Mg, similarly to the first invention. It is also allowable to form the high-concentration doped layer to the third layer in contact with the first layer. For the case where the high-concentration doped layer is formed by the additional diffusion of Zn, the dopant concentration in a portion of the third layer other than the high-concentration doped layer, that is, a portion in contact with the first layer, can be adjusted to as low enough as $1\times10^{17}/cm^3$ to $2\times10^{18}/cm^3$, both ends inclusive.

For the next etching step, the second layer can preferably be etched by a chemical etching similarly to as described in the first invention. In this case, it is effective to form, between the first layer and the second layer, a fourth layer composed of a Group III-V compound semiconductor different from those composing both layers, and to selectively remove the second layer in the next etching step using the first etching solution while using the fourth layer as an etching stopper layer The fourth layer is preferably composed of an Al-free Group III-V compound semiconductor.

For example, for the case where the second layer is composed of $Al_dGa_{1-d}P$ ($0<d\leq1$) or $(Al_bGa_{1-b})_cIn_{1-c}P$ ($0<b\leq1$; $0\leq c\leq0.5$), the first layer can be composed of $GaAs_{1-a}P_a$ ($0\leq a\leq1$), and hydrochloric acid is available as the etching solution for the second layer. For the case where oxidation of Al contained in the second layer may be anticipated, also the second layer is preferably composed of $GaAs_{1-a}P_a$ ($0\leq a\leq1$). In this case, it is advantageous to insert the fourth layer composed of $GaAs_{1-b}P_b$ ($a\leq b\leq1$) having a larger GaP alloy composition than that of the second layer from the viewpoint of ensuring an excellent etching selectivity between the second and fourth layers. In particular for the case where the second and first layers are composed of $GaAs_{1-a}P_a$ ($0.5\leq a\leq0.9$) and the fourth layer is composed of GaP, the fourth layer can exhibit an excellent etch stop effect. A typical example of the first etching solution available herein is sulfuric acid or a mixed solution of sulfuric acid and hydrogen peroxide. The thickness of the fourth layer is preferably adjusted within a range from 1 nm to 100 nm.

One possible process is such that the outer portion of the second layer is selectively removed by the chemical etching using the first etching solution while using the fourth layer as the etch stop layer, then the fourth layer exposed out from the second layer is selectively removed by the chemical etching using the second etching solution while using the first layer as the etch stop layer to thereby expose the first layer, and the third layer can be grown so as to come into contact with the outer portion of the first layer in the second vapor-phase growth step. It is also allowable to form the third layer while leaving the fourth layer exposed out from the second layer unetched if the thickness of the fourth layer is adjusted within a small range from 1 nm to 50 nm.

Next, a second constitution of a light emitting device of the third invention has a light emitting layer portion and a current spreading layer, respectively composed of a Group III-V compound semiconductor, once formed on a single crystal substrate by epitaxial growth, wherein:

the light emitting layer portion has a double heterostructure in which a p-type cladding layer, an active layer and an n-type cladding layer, all of which being composed of $(Al_xGa_{1-x})_yIn_{1-y}P$ (where, $0\leq x\leq1$ and $0\leq y\leq1$), are stacked in this order as viewed from the electrode side, where the electrode being provided for applying light emission drive voltage to the light emitting layer portion, and the p-type cladding layer is composed of p-type $(Al_xGa_{1-x})_yIn_{1-y}P$ containing at least either of Zn and Mg as the dopant;

the current spreading layer is formed, using at least either of Zn and Mg as the dopant, as a p-type $GaAs_{1-a}P_a$ ($0.5\leq a\leq0.9$) layer having a band gap energy larger than an optical energy corresponded to the peak emission wavelength of the light emitting layer portion; and the current spreading layer has an H concentration lower than that of the p-type cladding layer.

As for light emitting devices in which the light emitting layer portions are composed with an $(Al_xGa_{1-x})_yIn_{1-y}P$ double heterostructure, it is most general to define the p-type cladding layer side as the light extraction side, and to provide the current spreading layer on this side, because emission recombination is more likely to occur on the p-type cladding layer side considering difference in the mobility of holes and electrons. The current spreading layer, which has conventionally been formed by the MOVPE process, contains a large amount of residual H and C, so that when the layer is to be formed as a p-type layer using at least either of Zn and Mg as the dopant, the concentration of at least either of Zn and Mg must be set considerably higher than that in the p-type cladding layer in order to compensate a portion of the dopant possibly inactivated through bonding with the residual H. Nonconformities of shortened device life caused by such excessive dopant concentration are as described elsewhere in the above.

In the second constitution of a light emitting device of the third invention, the current spreading layer is composed of a p-type $GaAs_{1-a}P_a$ ($0.5\leq a\leq0.9$) layer which contains at least either of Zn and Mg as the dopant, and has a band gap energy larger than an optical energy corresponded to the peak emission wavelength of the light emitting layer portion, and the H concentration in the current spreading layer is set smaller than that in the p-type cladding layer. Such quantitative relation of the H concentration can readily be attained by forming the current spreading layer by the HVPE process. As a consequence, a sufficient level of conductivity can be ensured even when the concentration of at least either of Zn and Mg in the current spreading layer is set lower than that in the p-type cladding layer, because only a small amount of at least either of Zn and Mg can be inactivated through bonding with H. Thus lowered concentration of at least either of Zn and Mg can successfully improve the device life. Effects of the formation as $GaAs_{1-a}P_a$ ($0.5\leq a\leq0.9$) layer of the current spreading layer are absolutely same as described in the first constitution.

When the light emitting layer portion is composed of $(Al_xGa_{1-x})_yIn_{1-y}P$ (where, $0\leq x\leq1$ and $0<y\leq1$) as described in the above, it is preferable to form the current spreading layer as a $GaAs_{1-a}P_a$ ($0.5\leq a\leq0.9$; having a band gap energy larger than an optical energy corresponded to the peak emission wavelength of the light emitting layer portion) layer, to form a portion of the current spreading layer in contact with the light emitting layer portion as an MO layer portion grown by the metal organic vapor-phase epitaxy process, and to form the residual portion as an HVPE layer portion grown by the hydride vapor-phase epitaxy (HVPE) process. Although $(Al_xGa_{1-x})_yIn_{1-y}P$ composing the light emitting layer portion and $GaAs_{1-a}P_a$ ($0\leq a\leq1$) composing the current spreading layer are likely to largely differ from each other in the lattice constants, the crystallinity of the current spreading layer can be improved by first forming the portion of the current spreading layer in contact with the light emitting layer portion by the metal organic vapor-phase epitaxy process, and then by forming the residual portion of the current spreading layer by the HVPE process, as described in the above.

Fourth Invention

To solve the first subject, a method of fabricating a light emitting device according to a fourth invention is such as fabricating a light emitting device in which a light emitting layer portion and a current spreading layer respectively composed of a Group III-V compound semiconductor, are once stacked on a single crystal substrate, and the method comprises:

an off-angled substrate is used as the single crystal substrate:

and the method comprises:
- a first vapor-phase growth step for forming the light emitting layer portion which comprises an alloy compound semiconductor containing two or more Group III elements on the off-angled, single crystal substrate based on the metal organic vapor-phase epitaxy process; and
- a second vapor-phase growth step, carried out after the light emitting layer portion was formed, for forming the current spreading layer based on the hydride vapor-phase epitaxy process.

A first constitution of a light emitting device of the fourth invention has a light emitting layer portion and a current spreading layer, respectively composed of a Group III-V compound semiconductor, once formed on a single crystal substrate by epitaxy growth, wherein:

the single crystal substrate is an off-angled substrate;

the light emitting layer portion is composed of an alloy compound semiconductor containing two or more Group III elements, and is formed on the off-angled, single crystal substrate by the metal organic vapor-phase epitaxy process; and the current spreading layer is composed of a III-V compound semiconductor, and is formed on the light emitting layer portion by the hydride vapor-phase epitaxy process.

In the method of fabricating a light emitting device of the fourth invention, the light emitting layer portion which comprises an alloy compound semiconductor containing two or more Group III elements (referred to as "alloy light emitting layer portion", or simply as "light emitting layer portion", hereinafter) is formed by the metal organic vapor-phase epitaxy process. The process is now on the premise of using an off-angled, single crystal substrate It is to be noted that "off-angled" in the context of the specification means that the main crystal axis of the single crystal substrate, on which the compound semiconductor layers are stacked, is tilted by a predetermined angle with respect to the reference direction defined either to <100> or <111> direction.

In the growth of the alloy light emitting layer portion by the MOVPE process, use of a non-off-angled substrate may inhibit random distribution of the Croup III element in the alloy and may consequently result in undesirable atomic ordering or biased distribution. Because areas having such atomic ordering or biased distribution have band gap energies different from that of truly-expected alloy semiconductor, and this causes a distribution in the band gap energy of the crystal as a whole, and variation in the emission spectral profile or center wavelength. On the contrary, provision of a proper off-angled nature to the single crystal substrate can considerably reduce the above-described ordering or biased distribution of the Group III elements, and can successfully yield the light emitting devices having well-controlled emission spectral profile and center wavelength.

On the alloy light emitting layer portion thus grown by the MOVPE process, the current spreading layer composed of a III-V compound semiconductor is formed by the hydride vapor-phase epitaxy process (referred to as the HVPE process, hereinafter). Use of the HVPE process is advantageous in obtaining the current spreading layer with an excellent smoothness, although the off-angled, single crystal substrate is used, since the surface of the finally-obtained current spreading layer hardly causes facet and surface roughening ascribable to the crystal.

On the main surface of the current spreading layer opposite to the surface facing to the light emitting layer portion, an electrode for applying emission drive voltage to the light emitting layer portion is formed. Although using the off-angled, single crystal substrate, the surface of the current spreading layer is smoothened, and the adhesiveness of the electrode to be formed on the current spreading layer is improved. This is also advantageous for the case where automatic wire boding to the electrode is carried out based on image processing, since image detection errors due to the surface roughening is reduced and the process efficiency and yield ratio of the wire bonding process can be improved.

There is known a method for fabricating a light emitting device as disclosed in Japanese Laid-Open Patent Publication No. 5-275740 (U.S. Pat. No. 5,233,204), which is intended only for improving growth rate of the current spreading layer. The publication discloses the vapor-phase epitaxy process (referred to as the VPE process, hereinafter) and the liquid-phase epitaxy process (referred to as the LPE process, hereinafter) in parallel, but there is no description about superiority of these processes. Also there is no description about the use of the off-angled, single crystal substrate for the purpose of preventing the atomic ordering or biased distribution of the Group III element in the light emitting layer portion. There is still no description on specific features of the VPE process (also the MOVPE is a kind of the VPE process).

However, our extensive investigations into the difference between the VPE process and the LPE process for the case where the off-angled substrate was used revealed the following facts. As shown in FIG. 17, a relatively smooth surface of the current spreading layer was obtained by either of the VPE and LPE processes when the non-off-angled substrate was used, but caused variations in the emission wavelength due to the above-described atomic ordering. It can thus be said that both of the VPE and LPE processes are unsuccessful in obtaining desirable light emitting devices On the other hand, for the case where the off-angled, single crystal substrate were used, the LPE process extremely worsened the facet and surface roughening possibly ascribable to the off-angled nature, and also caused a large bias in the distribution of the Group III atoms, only to produce the current spreading layer far from being practical for the fabrication of the light emitting device. Assuming that if it were available anyhow, it may result in frequent image detection error in the automatic wire bonding due to the surface roughening, and ruins efficiency and yield ratio of the wire bonding process. The fourth invention is the first to succeed in ensuring desirable emission performance of the alloy light emitting layer portion by adopting the off-angled, single crystal substrate, and to succeed in obtaining desirable current spreading layer by adopting the HVPE process for the growth thereof.

Also in the fourth invention, the H concentration of the current spreading layer formed by the HVPE process can typically be suppressed to as low as $7 \times 10^{17}/cm^3$ or below. For the current spreading layer composed of a p-type $GaAs_{1-a}P_a$ ($0 \leq a \leq 1$) layer containing at least either of Zn and Mg as the dopant, it is preferable to select GaP alloy composition "a" so that the band gap energy thereof is larger than an optical energy corresponded to the peak emission wavelength of the light emitting layer portion. The carrier concentration of at least either of Zn and Mg in the current spreading layer can typically be set within a range from $1 \times 10^{17}/cm^3$ to $5 \times 10^{19}/cm^3$. Zn and Mg can be used separately or in combination.

For the case where the thickness of the current spreading layer is set small, it is preferable to form a high-concentration doped layer in a surficial area including the main surface on the electrode forming side of the current spreading layer, so as to have a carrier concentration of the dopant for generating majority carriers (for an exemplary case of p-type current spreading layer, the concentration of p-type dopant such as above-described Zn or Mg) higher than that in the residual portion of the current spreading layer. In particular for the case where the current spreading layer is formed as thin as 20 µm or less, provision of the high-concentration doped layer takes a large effect.

Also in the fourth invention, similarly to the first through third inventions, the high-concentration doped layer can be formed by the procedures below. That is, in the second vapor-phase growth step, the current spreading layer is formed by supplying a dopant gas together with a source gas for the Group III-V compound semiconductor; and after the second vapor-phase growth step, the dopant is additionally diffused from the surficial portion of the current spreading layer to thereby form the high-concentration doped layer. Also the additional diffusion can be carried out by the vapor-phase diffusion using the dopant gas. Advantage of forming the high-concentration doped layer is particularly distinctive when the current spreading layer is composed of p-type $GaAs_{1-a}P_a$ ($0.5 \leq a \leq 0.9$) containing at least either of Zn and Mg as the dopant. For the case where the HVPE layer is formed in the current spreading layer by the HVPE process, the HVPE layer can be formed so that the dopant concentration thereof on the major surface side close to the light emitting layer portion is lower than that in the p-type cladding layer. More specifically, the carrier concentration of at least either of Zn and Mg in the current spreading layer is preferably adjusted within a range from $2 \times 10^{18}/cm^3$ to $5 \times 10^{19}/cm^3$ in the high-concentration doped layer. On the other hand, the carrier concentration of at least either of Zn and Mg in the residual portion of the high-concentration doped layer is preferably adjusted within a range from $1 \times 10^{17}/cm^3$ to $2 \times 10^{18}/cm^2$.

For the case where the high-concentration doped layer is formed, the current spreading layer is composed of $GaAs_{1-a}P_a$, and this yields the following advantages. That is, when the high-concentration doped layer is formed by additional diffusion of Zn, a necessary thickness of the high-concentration doped layer can be formed in a short time since Zn exhibits a higher diffusion rate in $GaAs_{1-a}P_a$ than in GaP. It is to be noted that the GaP alloy composition "a" exceeding 0.9 may relatively reduce the GaAs alloy composition, and may result in only a limited promotion effect of Zn diffusion.

Although the current spreading layer in the fourth invention is not precluded from forming the entire portion thereof by the HVPE process, it is preferable to form a portion thereof in contact with the light emitting layer portion as the MO layer portion by the metal organic vapor-phase epitaxy process, and to form the residual portion as the HVPE layer portion by the hydride vapor-phase epitaxy process.

Also in the light emitting device of the fourth invention, it is allowable to form the current blocking layer as being buried composed of a Group III-V compound semiconductor having a conductivity type different from that of the current spreading layer, in the middle position in the thickness-wise direction of the current spreading layer. In this case, at least a portion of the current spreading layer covering the current blocking layer on the electrode side can be formed in the second vapor-phase growth step (i.e., by the HVPE process).

The current blocking layer forming step can specifically be carried out as including the following process steps, similarly to as described in the first and second inventions:

1. a third-vapor-phase growth process: in this step, a first layer which composes a part of the current spreading layer and is composed of a first-conductivity-type Group III-V compound semiconductor, and a second layer which composes the current blocking layer and is composed of a second-conductivity-type Group III-V compound semiconductor, are sequentially formed on the light emitting layer portion by the MOVPE process; and 2. etching step: in this step, an unnecessary portion of thus-obtained second-conductivity-type compound semiconductor layer is removed so as to leave a portion to be the current blocking layer.

Moreover in the second vapor-phase growth step, a third layer which comprises a Group III-V compound semiconductor having a conductivity type same as that of the first layer, is formed so as to cover a portion of the second layer left unetched, by the hydride vapor-phase epitaxy (HVPE) process.

Both of the first layer and second layer can be composed of a Group III-V compound semiconductor containing no Al (aluminum) which is a highly oxidizable element. More specifically, all of the first, second and third layers can be composed of $GaAs_{1-a}P_a$ ($0.5 \leq a \leq 0.9$; having a band gap energy larger than an optical energy corresponded to the peak emission wavelength of the light emitting layer portion).

It is to be noted that the second layer and first layer are composed of same $GaAs_{1-a}P_a$ ($0.5 \leq a \leq 0.9$) but opposite in the conductivity type. For example, if the third layer is composed of a p-type $GaAs_{1-a}P_a$ ($0.5 \leq a \leq 0.9$) containing at least either of Zn and Mg as the dopant, the second layer can be composed of an n-type $GaAs_{1-a}P_a$ ($0.5 \leq a \leq 0.9$) containing Si (silicon) or the like as the dopant. In the current spreading layer for this case, it is also allowable to use different kinds of dopants for the first layer to be formed by the MOVPE process and the third layer to be formed by the HVPE process. For a typical case where Zn is used as the dopant for the third layer, the dopant for the first layer may be Zn, or may be Mg in place of Zn.

The dopant of the first layer composed of $GaAs_{1-a}P_a$ ($0.5 \leq a \leq 0.9$) may be Mg, similarly to the first invention. It is also allowable to form the high-concentration doped layer to the third layer in contact with the first layer. For the case where the high-concentration doped layer is formed by the additional diffusion of Zn, the dopant concentration in a portion of the third layer other than the high-concentration doped layer, that is, a portion in contact with the first layer, can be adjusted to as low enough as $1 \times 10^{17}/cm^3$ to $2 \times 10^{18}/cm^3$, both ends inclusive.

For the next etching step, the second layer can preferably be etched by a chemical etching similarly to as described in the first invention. In this case, it is effective to form, between the first layer and the second layer, a fourth layer composed of a Group III-V compound semiconductor different from those composing both layers, and to selectively remove the second layer in the next etching step using the first etching solution while using the fourth layer as an etch stop layer. The fourth layer is preferably composed of an Al-free Group III-V compound semiconductor.

For example, for the case where the second layer is composed of $Al_dGa_{1-d}P$ ($0<d\leq1$) or $(Al_bGa_{1-b})_cIn_{1-c}P$ ($0<b\leq1$; $0\leq c\leq0.5$), the first layer can be composed of $GaAs_{1-a}P_a$ ($0\leq a\leq1$), and hydrochloric acid is available as the etching solution for the second layer. For the case where oxidation of Al contained in the second layer may be anticipated, also the second layer is preferably composed of GaAs$_{1-a}$P$_a$ (0≦a≦1). In this case, it is advantageous to insert the fourth layer composed of GaAs$_{1-b}$P$_b$ (a≦b≦1) having a larger GaP alloy composition than that of the second layer from the viewpoint of ensuring an excellent etching selectivity between the second and fourth layers. In particular for the case where the second and first layers are composed of GaAs$_{1-a}$P$_a$ (0.5≦a≦0.9) and the fourth layer is composed of GaP, the fourth layer can exhibit an excellent etch stop effect. A typical example of the first etching solution available herein is sulfuric acid or a mixed solution of sulfuric acid and hydrogen peroxide. The thickness of the fourth layer is preferably adjusted within a range from 1 nm to 100 nm One possible process is such that the outer portion of the second layer is selectively removed by the chemical etching using the first etching solution while using the fourth layer as the etch stop layer, then the fourth layer exposed out from the second layer is selectively removed by the chemical etching using the second etching solution while using the first layer as the etch stop layer to thereby expose the first layer, and the third layer can be grown so as to come into contact with the outer portion of the first layer in the second vapor-phase growth step. It is also allowable to form the third layer while leaving the fourth layer exposed out from the second layer unetched if the thickness of the fourth layer is adjusted within a small range from 1 nm to 50 nm.

The light emitting layer portion can be composed as having a double heterostructure in which a first-conductivity-type cladding layer, an active layer and a second-conductivity-type cladding layer, where all of which are composed of (Al$_x$Ga$_{1-x}$)$_y$In$_{1-y}$P (where, 0≦x≦1 and 0≦y≦1), are stacked in this order as viewed from the electrode side, where the electrode provided for applying light emission drive voltage to the light emitting portion. By virtue of energy barriers ascribable to difference of band gaps between the active layer and cladding layer on both sides thereof, holes and electrons injected into the active layer are well confined within a narrow active layer and allowed to efficiently recombine, and this ensures an excellent emission efficiency. In addition, compositional adjustment of the active layer can further expand a possible range of emission wavelength. The effect of the fourth invention is most distinctively exhibited when the current spreading layer is composed of a p-type layer containing at least either of Zn and Mg is used as the dopant, where the first-conductivity-type cladding layer herein is composed of p-type (Al$_x$Ga$_{1-x}$)$_y$In$_{1-y}$P.

The light emitting layer portion comprising (Al$_x$Ga$_{1-x}$)$_y$In$_{1-y}$P tends to reduce the band gap energy due to the aforementioned ordering or biased distribution of the Group III element (Al, Ga, In) for the case where non-off-angled, single crystal substrate is used, and this tends to cause variation in the emission wavelength in the shorter wavelength region. One possible measure for solving this problem is a method of compensating the shift of emission wavelength by raising alloy composition of AlP, which has a large band gap energy. Such raising of AlP alloy composition, however, alters the band structure so as to increase indirect transition components, and this undesirably tends to lower the emission intensity. The use of (Al$_x$Ga$_{1-x}$)$_y$In$_{1-y}$P for the light emitting layer portion is most beneficial for the case where the off-angled, single crystal substrate is used, where the fourth invention exhibits an excellent effect.

For the case where the light emitting layer portion is composed of (Al$_x$Ga$_{1-x}$)$_y$In$_{1-y}$P, the single crystal substrate may be a GaAs single crystal substrate having the main axis tilted by an angle 1° to 25° with respect to the <100> direction or <111> direction. The off-angle less than 1° may be insufficient for suppressing the aforementioned variation in the emission characteristics (emission spectral profile and center wavelength), and exceeding 25° may inhibit normal growth of the light emitting layer portion. Effect of the invention becomes particularly discriminative when the GaAs single crystal substrate has the main axis thereof tilted by an angle as defined in the above with respect to the <100> direction.

The single crystal substrate more preferably has the main axis thereof tilted by 10° to 20°. Use of such largely-off-angled GaAs substrate can further improve the smoothing effect of the surface of the current spreading layer finally attained by the HVPE process in the second vapor-phase growth step. According to the investigation by the inventors, the single crystal substrate having an angle of tilt of 1° to 10° successfully suppressed a facet-like uniform surface irregularity having a small amplitude, but not a few projection-like crystal defects having a large amplitude sometimes remained, and caused nonconformities such am detection errors in image processing in the wire bonding process. On the contrary, raising of the angle of tilt to as large as 10° to 20° was found to effectively suppress generation of such projection-like crystal defects.

As well as prevention of the projection-like crystal defects, optimization of the growth temperature of the current spreading layer in the HVPE process is also an essential point to obtain the desirable surface of the current spreading layer in the manufacturing step. One of essential effects of selection of the angle of tilt within a range from 10° to 20° resides in that an appropriate range of the growth temperature of the current spreading layer by the HVPE process can be lowered. Lowering of the growth temperature of the current spreading layer can desirably moderate heat history possibly exerted on the light emitting layer portion which underlies the current spreading layer during the growth of the current spreading layer, and can make dopant profile at the p-n junction in the light emitting layer portion less causative of degradation by diffusion. In particular for the light emitting layer portion having a double heterostructure, it is desired for the active layer to reduce the dopant concentration as low as possible in order to raise efficiency of emission by recombination. Lowering of the growth temperature of the current spreading layer can successfully suppress the dopant diffusion from the cladding layer towards the active layer, can raise the internal quantum efficiency of the light emitting device, and can largely improve the emission performance. Lowering of the growth temperature is still also advantageous in that the current spreading layer can be made more thicker while keeping the dopant profile in a desirable state, and that effect of improving the emission intensity becomes particularly eminent when the thickness of the current spreading layer is increased as large as 50 μm or above.

The angle of tilt less than 10° or exceeding 20° may result in only an insufficient effect of preventing generation of the projection-like crystal defects, and a poor effect of lowering the appropriate growth temperature of the current spreading layer. Therefore the angle of tilt is more preferably set within a range from 13° to 17°.

In this case, in the growth of the current spreading layer composed of GaAsP by the HVPE process in the second vapor-phase growth step, the growth temperature is preferably set within a range from 640° C. to 750° C., both ends inclusive. The temperature lower than 640° C. may result in only an insufficient effect of smoothing the surface of the current spreading layer, and in particular of suppressing generation of the projection-like crystal defects. On the contrary, the temperature higher than 750° C. may result in only a limited effect of suppressing degradation of dopant profile of the light emitting layer portion. The growth temperature is more preferably set within a range from 680° C. to 720° C. (in particular for the case the angle of tilt falls within a range from 13° to 17°). This temperature setting ensures a particularly discriminative effect of improving the emission intensity when the current spreading layer has a thickness of as large as 50 μm or above (and 200 μm or below).

A second constitution of a light emitting device of the fourth invention has a light emitting layer portion and a current spreading layer, respectively composed of a Group III-V compound semiconductor, once formed on a single crystal substrate by epitaxial growth, wherein:

the single crystal substrate is an off-angled substrate;

the light emitting layer portion has a double heterostructure in which a p-type cladding layer, an active layer and an n-type cladding layer, all of which being composed of $(Al_xGa_{1-x})_yIn_{1-y}P$ (where, $0 \leqq x \leqq 1$ and $0 < y \leqq 1$) containing two or more Group III elements, are stacked in this order as viewed from the electrode side, where the electrode being provided for applying light emission drive voltage to the light emitting layer portion, and the p-type cladding layer is composed of p-type $(Al_xGa_{1-x})_yIn_{1-y}P$ containing at least either of Zn and Mg as the dopant;

the current spreading layer is formed, using at least either of Zn and Mg as the dopant, as a p-type $GaAs_{1-a}P_a$ ($0 \leqq a \leqq 1$) layer having a band gap energy larger than an optical energy corresponded to the peak emission wavelength of the light emitting layer portion: and the current spreading layer has a H concentration lower than that in the p-type cladding layer.

As for light emitting devices in which the light emitting layer portions are composed with an $(Al_xGa_{1-x})_yIn_{1-y}P$ double heterostructure, it is most general to define the p-type cladding layer side as the light extraction side, and to provide the current spreading layer on this side, because emission recombination is more likely to occur on the p-type cladding layer side considering difference in the mobility of holes and electrons. The current spreading layer, which has conventionally been formed by the MOVPE process, contains a large amount of residual H and C, so that when the layer is to be formed as a p-type layer using at least either of Zn and Mg as the dopant, the concentration of at least either of Zn and Mg must be set considerably higher than that in the p-type cladding layer in order to compensate a portion of the dopant possibly inactivated through bonding with the residual H. Nonconformities of shortened device life caused by such excessive dopant concentration are as described elsewhere in the above.

In the second constitution of a light emitting device of the fourth invention, the current spreading layer is composed of a p-type $GaAs_{1-a}P_a$ ($0 \leqq a \leqq 1$) containing at least either of Zn and Mg as the dopant, and the H concentration in the current spreading layer is set smaller than that in the p-type cladding layer. Such quantitative relation of the H concentration can readily be attained by forming the current spreading layer by the HVPE process. As a consequence, a sufficient level of conductivity can be ensured even when the concentration of at least either of Zn and Mg in the current spreading layer is set lower than that in the p-type cladding layer, because only a small amount of at least either of Zn and Mg can be inactivated through bonding with H. Thus lowered concentration of at least either of Zn and Mg can successfully improve the device life.

When the light emitting layer portion is composed of $(Al_xGa_{1-x})_yIn_{1-y}P$ (where, $0 \leqq x \leqq 1$ and $0 < y \leqq 1$) as described in the above, it is preferable to form the current spreading layer as a $GaAs_{1-a}P_a$ ($0 \leqq a \leqq 1$; having a band gap energy larger than an optical energy corresponded to the peak emission wavelength of the light emitting layer portion) layer, to form a portion of the current spreading layer in contact with the light emitting layer portion as an MO layer portion grown by the metal organic vapor-phase epitaxy process, and to form the residual portion as an HVPE layer portion grown by the hydride vapor-phase epitaxy (HVPE) process. Although $(Al_xGa_{1-x})_yIn_{1-y}P$ composing the light emitting layer portion and $GaAs_{1-a}P_a$ ($0 \leqq a \leqq 1$) composing the current spreading layer are likely to largely differ from each other in the lattice constants, the crystallinity of the current spreading layer can be improved by first forming the portion of the current spreading layer in contact with the light emitting layer portion by the metal organic vapor-phase epitaxy process, and then by forming the residual portion of the current spreading layer by the HVPE process, as described in the above.

In the light emitting devices according to the first, second, third and fourth inventions, the portion of the current spreading layer formed by the HVPE process preferably has an H concentration of $7 \times 10^{17}/cm^3$ or below.

The thickness of the current spreading layer is preferably set within a range from 5 μm to 200 μm. In the surficial portion of the current spreading layer including the main surface on the side on which the electrode is formed, it is allowable to form a high-concentration doped layer having at least either of Zn and Mg concentration higher than that in the residual portion of the current spreading layer. The current spreading layer is formed as a p-type semiconductor layer containing at least either of Zn and Mg as a dopant(s), where carrier concentration of the dopant is set to $2 \times 10^{18}/cm^3$ to $5 \times 10^{19}/cm^3$ for the high-concentration doped layer, and $1 \times 10^{17}/cm^3$ to $2 \times 10^{18}/cm^3$ for the residual portion. It is also allowable to compose a portion of the current spreading layer, on which the electrode is formed, with a high-GaAs-alloy-composition $GaAs_{1-a}P_a$ ($0 \leqq a < 1$) layer having a GaAs alloy composition 1-a larger than that in the residual portion, and to form the high-concentration doped layer containing Zn as a dopant in such high-GaAs-alloy-composition $GaAs_{1-a}P_a$ layer.

It is still also allowable to remain the single crystal substrate, once used for the epitaxial growth of the light emitting layer portion and current spreading layer, unremoved within the device. For the case where a light-absorbing, single crystal substrate such as GaAs substrate is used, the substrate may be removed after the epitaxial growth of the light emitting layer portion and current spreading layer. The light emitting device in which the single crystal substrate is not removed will have a constitution in which the light emitting layer portion and current spreading layer, respectively composed of a Group III-V compound semiconductor, are formed on such single crystal substrate

DESCRIPTION OF THE PREFERRED EMBODIMENTS

First Embodiment

Figure 1:
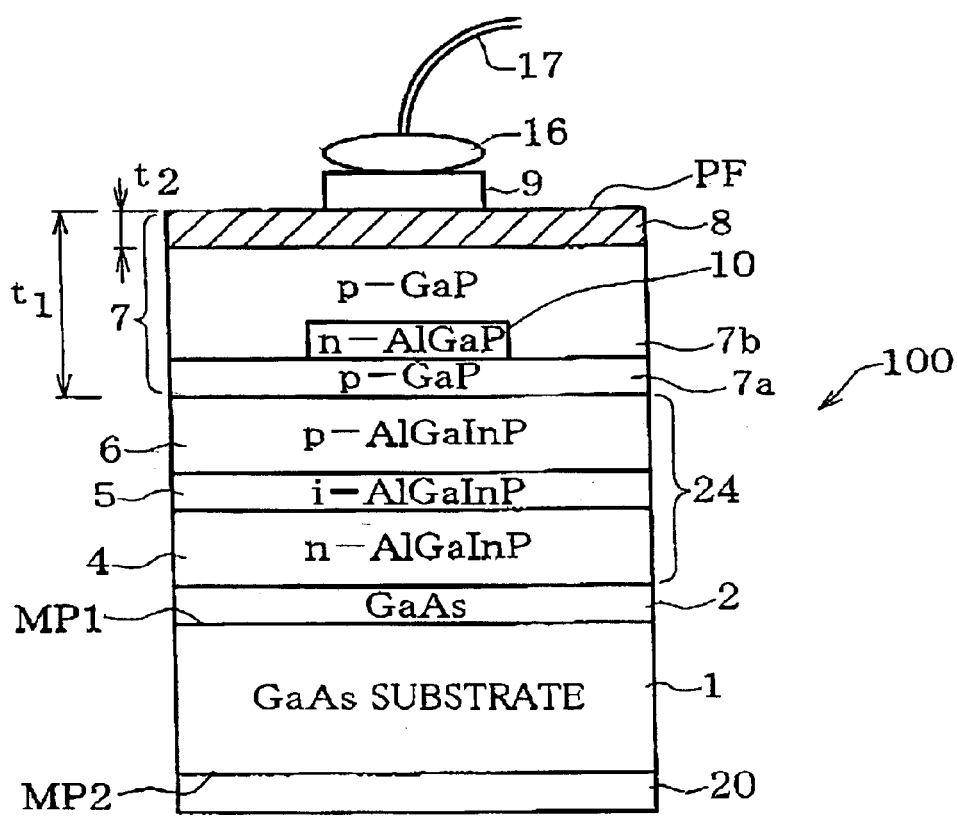
FIG. 1 is a schematic view of a stacked structure of an exemplary light emitting device of the first invention.

The first embodiment herein shows an exemplary preferable embodiment of the first and second inventions. FIG. 1 is a schematic view of a light emitting device 100 according to the first embodiment of the invention. The light emitting device 100 has an essential portion of the device formed on a first main surface MP1 of an n-type GaAs single crystal substrate (simply referred to as "substrate", hereinafter) 1. An n-type GaAs buffer layer 2 is formed so as to contact with the first main surface MP1 of the substrate 1, and on the buffer layer 2, a light emitting layer portion 24 is formed. On the light emitting layer portion 24, a current spreading layer 7 is formed, and further on the current spreading layer 7, a first electrode 9 for applying emission drive voltage to the light emitting portion 24 is formed. On a second main surface MP2 of the substrate 1, a second electrode 20 is similarly formed over the entire surface thereof. The first electrode 9 is formed approximately at the center of the first main surface PF, where the area around the first electrode 9 serves as an area through which light from the light emitting layer portion 24 is extracted. At the center of the first electrode 9, a bonding pad 16 typically composed of Au is disposed to which a electrode wire 17 is bonded.

The light emitting layer portion 24 is composed so that an active layer 5 composed of a non-doped $(Al_xGa_{1-x})_yIn_{1-y}P$ alloy (where, $0 \leq x \leq 0.55$, $0.45 \leq y \leq 0.55$) is placed between a p-type cladding layer 6 composed of p-type $(Al_zGa_{1-z})_yIn_{1-y}P$ (where, $x<z \leq 1$) and an n-type cladding layer 4 composed of n-type $(Al_zGa_{1-z})_yIn_{1-y}P$ (where, $x<z \leq 1$). In the light emitting device 100 shown in FIG. 1, the p-type AlGaInP cladding layer 6 is disposed on the first electrode 9 side, and the n-type AlGaInP cladding layer 4 is disposed on the second electrode 20 side. The device thus has positive polarity on the first electrode 9 side. It is to be noted now that "non-doped" in this context means that "the dopant is not intentionally added", and is not precluded from being inevitably added with the dopant component during normal fabrication processes (where the upper limit set at $10^{13}$ to $10^{16}/cm^3$ or around).

The current spreading layer 7 is formed as a p-type GaP layer containing Zn as a dopant. The H and Zn concentrations in the current spreading layer 7 are individually set lower than those in the p-type cladding layer 6. The current spreading layer 7 also has a current blocking layer 10 composed of n-type $Al_dGa_{1-d}P$ (e.g., d=0.2), which is buried therein at a position corresponded to the first electrode 9. The thickness $t_1$ of the current spreading layer typically falls within a range from 5 μm to 20 μm (10 μm, for example). The thickness of the current blocking layer 10 is typically falls within a range from 0.05 μm to 1 μm (0.1 μm, for example). The thickness $t_1$ of the current spreading layer 7 typically falls within a range from 5 μm to 200 μm (50 μm, for example). The thickness of the current blocking layer 10 typically fails within a range from 0.05 μm to 1 μm (0.1 μm, for example).

In a surficial area of the current spreading layer 7 including the main surface on the side on which the first electrode 9 is formed, a high-concentration doped layer 8 having Zn concentration higher than that in the residual portion of the current spreading layer 7 is formed. The Zn concentration of the current spreading layer 7 is adjusted within a range from $2\times10^{18}/cm^3$ to $5\times10^{19}/cm^3$ ($1\times10^{19}/cm^3$, for example) for the high-concentration doped layer 8, and from $1\times10^{17}/cm^3$ to $2\times10^{18}/cm^3$ ($8\times10^{17}/cm^3$, for example) for the residual portion.

The thickness $t_2$ of the high-concentration doped layer 8 is adjusted within a range from 1 μm to 4 μm (3 μm, for example). It is to be noted that the thickness $t_2$ of the high-concentration doped layer 8 is defined by setting a boundary between the high-concentration doped layer 8 and the residual portion at a position along the thickness-wise direction where $(N_{max}+N_{min})/2$ is established, where $N_{max}$ is concentration of the p-type dopant (i.e., Zn concentration in the embodiment) in the surficial area of the current spreading layer where the dopant concentration becomes maximum, and $N_{min}$ is a p-type dopant concentration in the portion of the current spreading layer 7 not affected by the diffusion. The dopant concentration and H concentration in the individual layers herein are defined as those measured by secondary ion mass spectrometry (SIMS). The carrier concentration can be determined by any publicly-known conductivity measurement.

Of the current spreading layer 7, the portion resides between the p-type cladding layer 6 and current blocking layer 10 refers to a first layer 7a formed by the MOVPE process. On the opposite side of the first layer 7a while placing the current blocking layer 10 (and a fourth layer 11) in between, a third layer 7b which composes a principal portion of the current spreading layer 7 is formed so as to cover, together with the first layer 7a, the current blocking layer 10. The third layer 7b is formed by the HVPE process described later, and the surficial portion thereof on the first electrode 9 side is provided as the aforementioned high-concentration doped layer 8 formed by the additional diffusion of Zn.

The H concentration in the current spreading layer 7 formed by the VHPE process can be adjusted lower than the H concentration in the p-type cladding layer 6 (generally $15\times10^{17}/cm^3$ or around) formed by the MOVPE process In the embodiment, of the current spreading layer 7, only the first layer 7a is formed by the MOVPE process and has a slightly higher H concentration. On the other hand, the third layer 7b has an H concentration of as low as $7\times10^{17}/cm^3$ or below, and normally $2\times10^{17}/cm^3$ or below. Because the thickness of the first layer 7a is far smaller than that of the third layer 7b, the H concentration in the current spreading layer 7 is, in any event, sufficiently lower than that in the p-type cladding layer 6. Of the third layer 7b composing the essential portion of the current spreading layer 7, the portion other than the high-concentration doped layer 8 can successfully ensure a satisfactory level of electric conductivity because only a small amount of Zn is inactivated through bonding with H even when Zn concentration is adjusted lower than that in the p-type cladding layer. This contributes to longer device life.

In the current spreading layer 7, in-plane current spreading mainly proceeds within the high-concentration doped layer 8. Because the inner portion of the current spreading layer 7 other than the high-concentration doped layer 8 has a lower carrier concentration of the dopant and consequently has a higher resistance, the current once entered the inner portion is less likely to re-spread along the in-plane direction, but is instead more likely to be bypassed towards the circumferential area around the electrode 9. Thus the light extraction efficiency improves.

While the first layer 7a and third layer 7b in the embodiment were formed using the same compound semiconductor (more specifically, GaP), they can also be formed using compound semiconductors differing with each other. For example, the first layer 7a can be formed using $GaAs_{1-a}P_a$ (having a band gap energy larger than an optical energy corresponded to the peak emission wavelength of the light emitting layer portion), and the third layer 7b using GaP. Both of the first layer 7a and third layer 7b are added with p-type dopant. While the p-type dopant may be Zn for both layers 7a, 7b as in the embodiment, it is also allowable to use at least either of Mg and C, which are less likely to spread towards the p-type cladding layer 6, for the first layer 7a formed by the MOVPE process, and to use Zn for the third layer 7b formed by the HVPE process.

Next paragraphs will describe a method of fabricating the light emitting device 100 shown in FIG. 1.

Figure 2A:
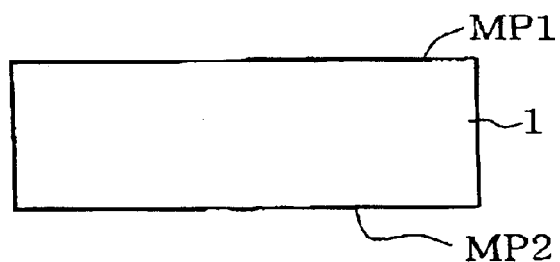
FIG. 2A is an explanatory chart showing a process step of fabricating the light emitting device shown in FIG. 1.
Figure 2B:
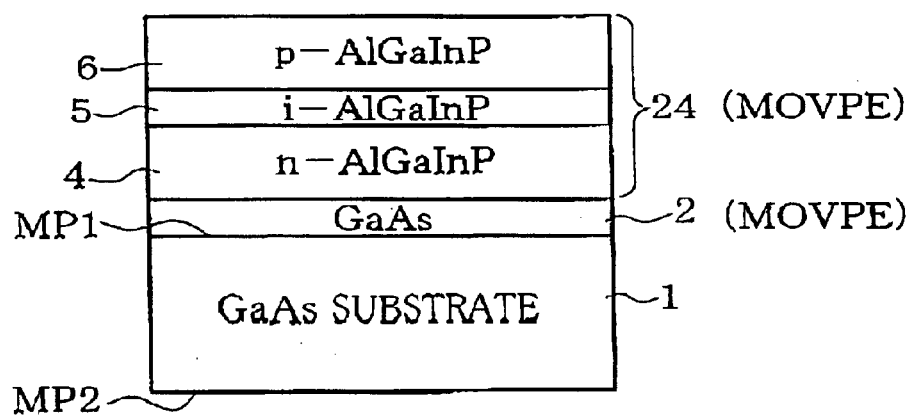
FIG. 2B is an explanatory chart as continued from FIG. 2A.

First, as shown in FIG. 2A for process step 1, the GaAs single crystal substrate 1 is prepared. Next, as shown in FIG. 2B for process step 2, on the first main surface MP1 of the substrate 1, the n-type GaAs buffer layer 2 of 0.5 μm thick and the light emitting layer portion 24 are formed, where the light emitting layer portion 24 comprises the n-type cladding layer 4 (containing Si as the n-type dopant) of 1 μm thick, the (non-doped) active layer 5 of 0.6 μm thick, and a p-type cladding layer 6 of 1 μm thick (containing Mg as the p-type dopant, where also C ascribable to organo-metallic compound molecules possibly contributes as the p-type dopant), all of which composed of $(Al_xGa_{1-x})_yIn_{1-y}P$, stacked in this order by epitaxial growth (first vapor-phase growth step). The epitaxial growth of the individual layers can be carried out according to the publicly-known MOVPE process. Examples of the source gases available as the individual sources of Al, Ga, In (indium) and P (phosphorus) are as follows:

Al source gas: trimethyl aluminum (TMA1), triethyl aluminum (TEA1), etc.;

Ga source gas: trimthyl gallium (TMGa), triethyl gallium (TEGa), etc.;

In source gas: trimethyl indium (TMIn), triethyl indium (TEIn), etc.; and

P source gas: trimethyl phosphorus (TMP), triethyl phosphorus (TEP), phosphine ($PH_3$), etc.

Figure 3A:
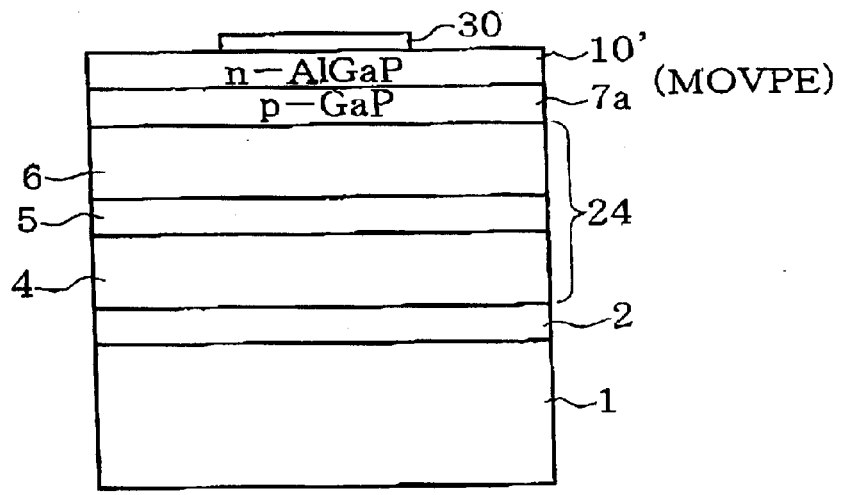
FIG. 3A is an explanatory chart as continued from FIG. 2B.
Figure 3B:
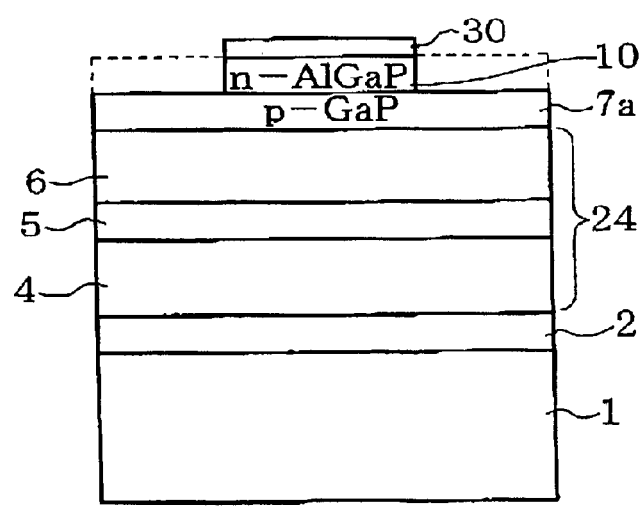
FIG. 3B is an explanatory chart as continued from FIG. 3A.

Next as shown in FIG. 3A for process step 3, successively in the same reaction chamber used in the first vapor-phase growth step, the first layer 7a composed of p-type GaP (MO layer portion) and the second layer 10' composed of n-type $Al_dGa_{1-d}P$ (e.g., d=0.2) on the light emitting layer portion 24 already formed, which is processed to form the current blocking layer, are sequentially formed by the MOVPE process. Next, a portion of the second layer 10' to be left unetched as the current blocking layer 10 is covered with a photo-resist layer 30. Next, as shown in FIG. 3B for process step 4, etching is carried out using a first etching solution comprising hydrochloric acid so as to selectively remove the portion of the second layer 10' not covered by the photo-resist layer 30. After the etching, the etching solution is rinsed off, and the photo-resist layer 30 is removed.

Figure 4A:
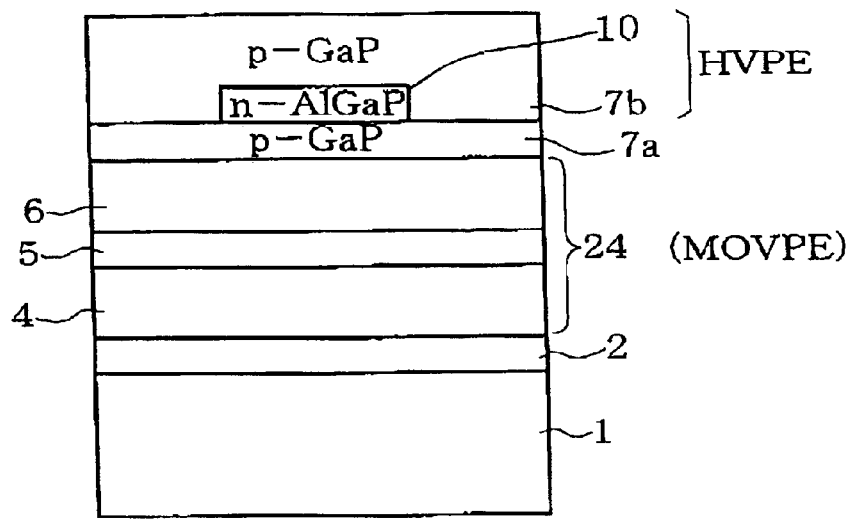
FIG. 4A is an explanatory chart as continued from FIG. 3B.

Next, as shown in FIG. 4A for process step 5, the third layer 7b (HVPE layer portion) composed of p-type GaP is formed by the HVPE process so as to cover the current blocking layer 10 (second vapor-phase growth step). In the HVPE process, Ga as a Group III element is kept under heating at a predetermined temperature within a chamber, hydrogen chloride gas is supplied over Ga to thereby allow GaCl to produce as expressed by the reaction formula (1) below, and the resultant GaCl is supplied to the substrate together with $H_2$ gas as a carrier gas.

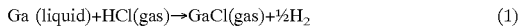
$$Ga\ (liquid) + HCl(gas) \rightarrow GaCl(gas) + \tfrac{1}{2}H_2 \qquad (1)$$

When GaP is grown, the growth temperature is typically set at 640 to 860° C. P as a Group V element is supplied in a form of $PH_3$ together with $H_2$ as a carrier gas. The third layer 7b which composes the essential portion of the current spreading layer 7 can be formed as expressed by the reaction formula (2) below, in which Ga is efficiently reacted with a hydride of a Group V element such as Zn which serves as a p-type dopant.

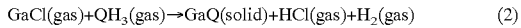
$$GaCl(gas) + QH_3(gas) \rightarrow GaQ(solid) + HCl(gas) + H_2(gas) \qquad (2)$$

(where, Q represents a Group V element)

By forming the third layer 7b composing the essential portion of the current spreading layer 7 by the HVPE process, any large step having a pattern loosely conforming to the current blocking layer 10 and defects are successfully prevented from occurring on the first main surface PF of the current spreading layer 7, and the smoothness of the first main surface PF of the current spreading layer 7 is improved.

Figure 4B:
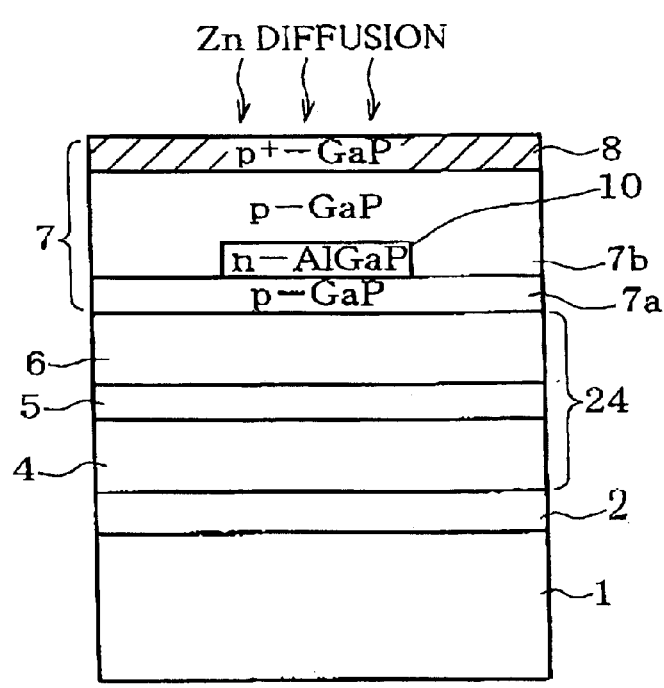
FIG. 4B is an explanatory chart as continued from FIG. 4A.

After the growth of the third layer 7b, the process advances to process step 6 shown in FIG. 4B, where the substrate is transferred into another chamber, heated typically 650 to 750° C. (e.g., 700° C.), supplied with vapor of a Group V element compound ($Zn_3As_2$, $Zn_3P_2$, etc.), and subjected to vacuum diffusion. By this process, Zn component is additionally diffused into the third layer 7b on the electrode forming side, and the high-concentration doped layer 8 is formed. The diffusion time is selected depending on to what thickness $t_2$ the high-concentration doped layer 8 is to be grown. Selection of at least either of Mg and C, having a relatively small coefficient of diffusion, as the p-type dopant used for the p-type cladding layer 6 is beneficial, because such p-type dopant is less likely to diffuse from the p-type cladding layer 6 towards the active layer 5 even under heating at the growth temperature during formation of the current spreading layer 7 by the HVPE process. This improves the emission intensity.

After completion of these process steps, the first electrode 9 and second electrode 20 are formed by the vacuum evaporation process, further on the first electrode 9 a bonding pad 16 is disposed, and the substrate is then subjected to baking at a proper temperature for fixing the electrode. The second electrode 20 is then fixed to a terminal electrode (also used as a device supporting base), not shown, using a conductive paste such as an Ag paste, an Au-made wire 17 is bonded so as to bridge the bonding pad 16 and other terminal electrodes, and the entire portion is molded with a resin to thereby obtain the light emitting device 100. The bonding of the wire 17 herein is carried out using an automatic bonding apparatus in which images of the first main surface of the device are taken by a camera, and the area around the bonding pad 16 is identified by a publicly-known image processing technique. In this process, nonconformities such as causing detection error of the area around the bonding pad 16 are less likely to occur since the surface of the current spreading layer 7 is smooth.

Effects of the HVPE process were confirmed by the experiments below.

The light emitting device was fabricated similarly to as shown in FIG. 1 except that the first electrode 9, bonding pad 16 and electrode wire 17 are not formed. The thickness of the current spreading layer 7 was set to 10 $\mu$m, and the thickness of the current blocking layer 10 to 0.1 $\mu$m. A light emitting device having the current spreading layer 7, the entire portion of which formed by the MOVPE process, was also fabricated for comparison.

Figure 7A:
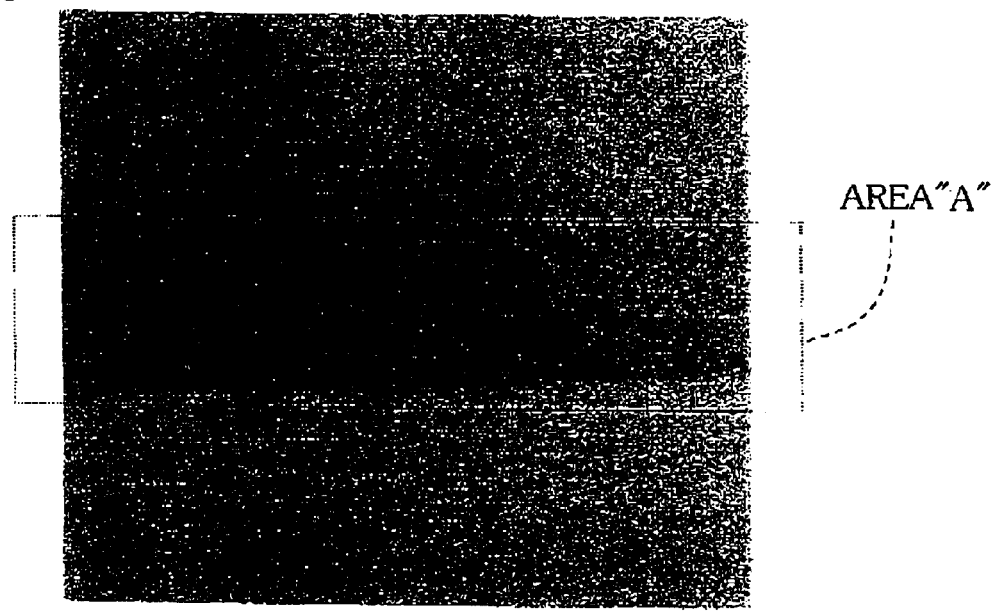
FIG. 7A is a photograph showing an outer appearance of a surface profile of the current spreading layer around the edge of the current blocking layer as compared between the HVPE process and MOVPE process.
Figure 7B:
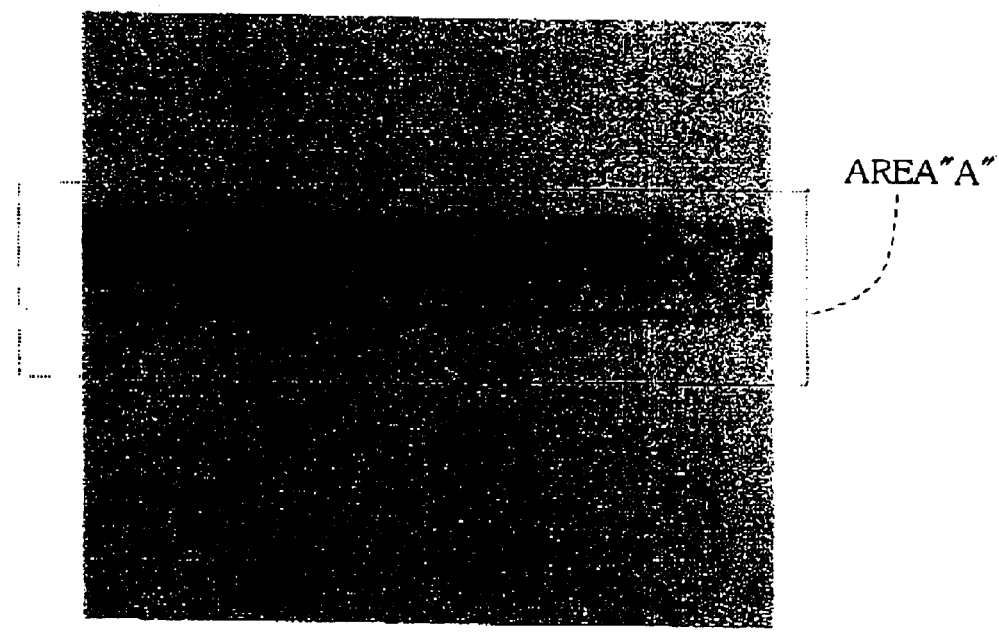
FIG. 7B is again a photograph showing an outer appearance of a surface profile of the current spreading layer around the edge of the current blocking layer as compared between the HVPE process and MOVPE process.

The surface profile of the first main surface PF of the light emitting device around an area directly over the current blocking layer was evaluated by observing from the direction vertical to the plane under an optical microscope. The results are shown in FIGS. 7A and 7B. FIG. 7A corresponds to the example of the invention and FIG. 7B corresponds to the comparative example Both observations were made at a magnification of 200×, where any area having deformed patterns are expressed in a low brightness.

In the comparative example shown in FIG. 7B, a strong contrast can be seen in area corresponded to the edge of a current blocking layer (an area "A" enclosed with a broken line), which is ascribable to a large step caused by a deformed pattern. A number of crystal defects patterns are also found in the step-forming area. On the contrary in the example of the invention shown in FIG. 7A, only a small contrast is found in area "A" corresponded to the edge of the current blocking layer, which indicates a small step. There is almost no crystal defect pattern. It is thus concluded that the current blocking layer formed by the HVPE process has an extremely smoother surface profile and much less crystal defects as compared with that obtained in the the MOVPE process.

Second Embodiment

Figure 8:
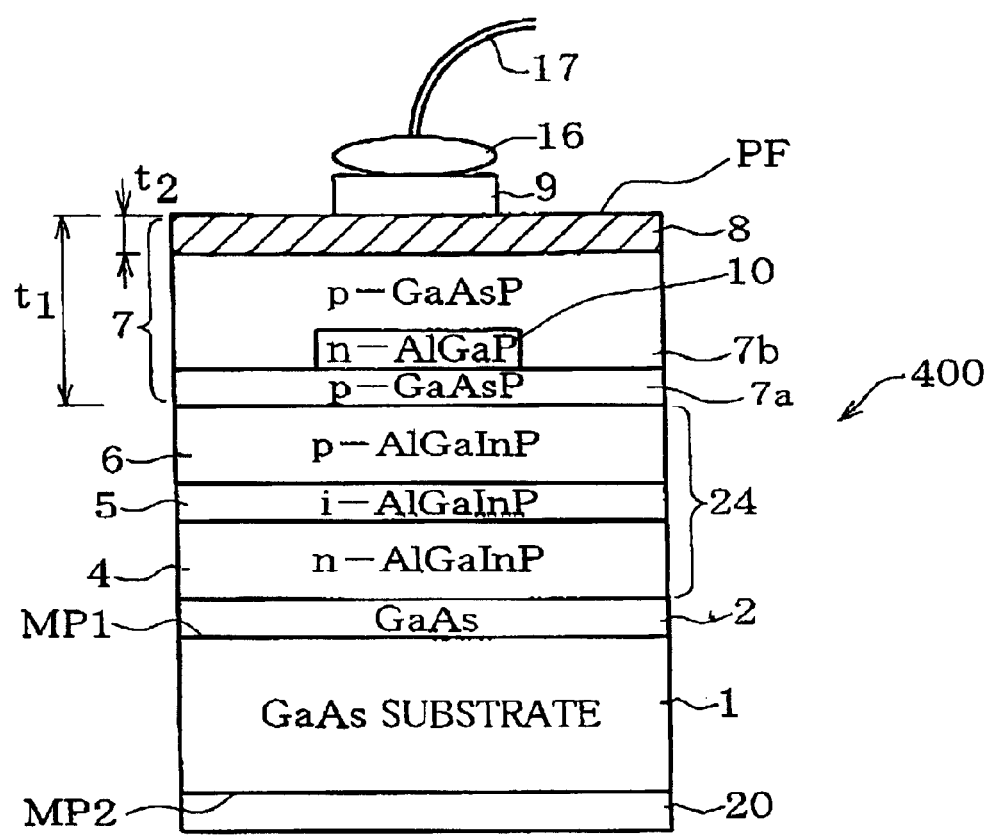
FIG. 8 is a schematic view of a stacked structure of an exemplary light emitting device of the third invention.

The second embodiment herein shows an exemplary preferable embodiment of the third invention. FIG. 8 is a schematic view of a light emitting device 400 according to the third embodiment of the invention. The following description will mainly deal with only points differed from those of the light emitting device 100 previously shown in FIG. 1, and any common points therewith will not be detailed. In the light emitting device 400, the current spreading layer 7 is composed of a p-type $GaAs_{1-a}P_a$ ($0.5 \leq a \leq 0.9$; having a band gap energy larger than an optical energy corresponded to the peak emission wavelength of the light emitting layer portion) layer containing Zn as a dopant. While the first layer 7a and the third layer 7b are formed with the same compound semiconductor, it is also allowable to form these layers with different compound semiconductors (for example, using $GaAs_{1-a}P_a$ alloys having different GaP alloy compositions). The thickness $t_1$ of the current spreading layer 7 typically falls within a range from 5 $\mu$m to 200 $\mu$m (50 $\mu$m, for example). The thickness of the current blocking layer 10 typically falls within a range from 0.05 $\mu$m to 1 $\mu$m (0.1 $\mu$m, for example).

The next paragraphs will describe a method of fabricating the light emitting device 400.

Figure 9A:
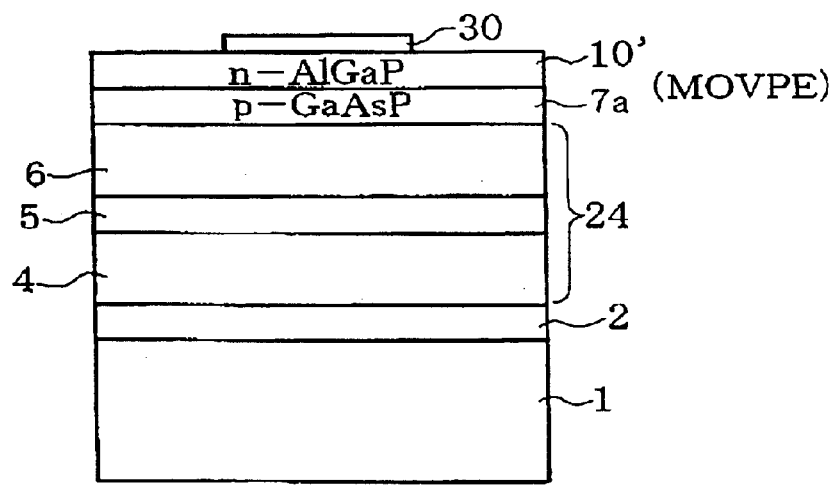
FIG. 9A is an explanatory chart showing a process step of fabricating the light emitting device shown in FIG. 8.
Figure 9B:
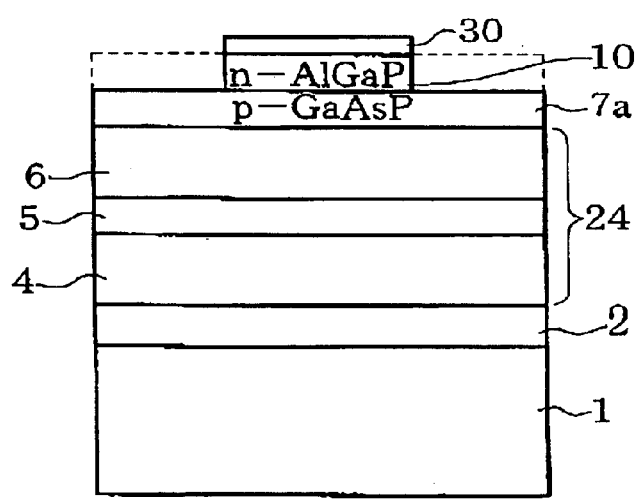
FIG. 9B is an explanatory chart as continued from FIG. 9A.

First, process steps 1 and 2 shown in FIGS. 2A and 2B, respectively, are carried out similarly to as described for the light emitting device 100 of the first embodiment. Next, in process step 3' shown in FIG. 9A, successively in the same reaction chamber used in the first vapor-phase growth, the first layer 7a composed of p-type $GaAs_{1-a}P_a$ ($0.5 \leq a \leq 0.9$; MO layer portion) and the second layer 10' composed of n-type $Al_dGa_{1-d}P$ (e.g., d=0.2) on the light emitting layer portion 24 already formed, which is processed to form the current blocking layer, are sequentially formed by the MOVPE process. Next, a portion of the second layer 10' to be left unetched as the current blocking layer 10 is covered with a photo-resist layer 30. Next, as shown in FIG. 9B for process step 4', etching is carried out using a first etching solution comprising hydrochloric acid so as to selectively remove the portion of the second layer 10' not covered with the photo-resist layer 30. After the etching, the etching solution is rinsed off, and the photo-resist layer 30 is removed.

Figure 10A:
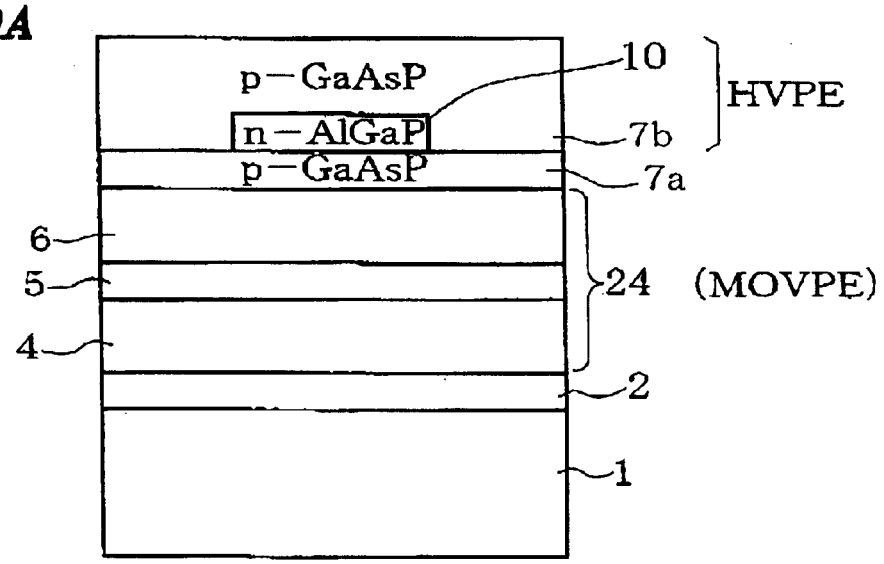
FIG. 10A is an explanatory chart as continued from FIG. 9B.

Next, as shown in FIG. 10A for process step 5', the third layer 7b (HVPE layer portion) composed of $GaAs_{1-a}P_a$ ($0.5 \leq a \leq 0.9$) is formed by the HVPE process so as to cover the current blocking layer 10 (second vapor-phase growth step). When $GaAs_{1-a}P_a$ ($0.5 \leq a \leq 0.9$) is grown, the growth temperature is typically set at 640 to 830° C. As (arsenic) or P as a Group V element is supplied in a form of trihydride ($AsH_3$, $PH_3$) together with $H_2$ as a carrier gas.

Figure 10B:
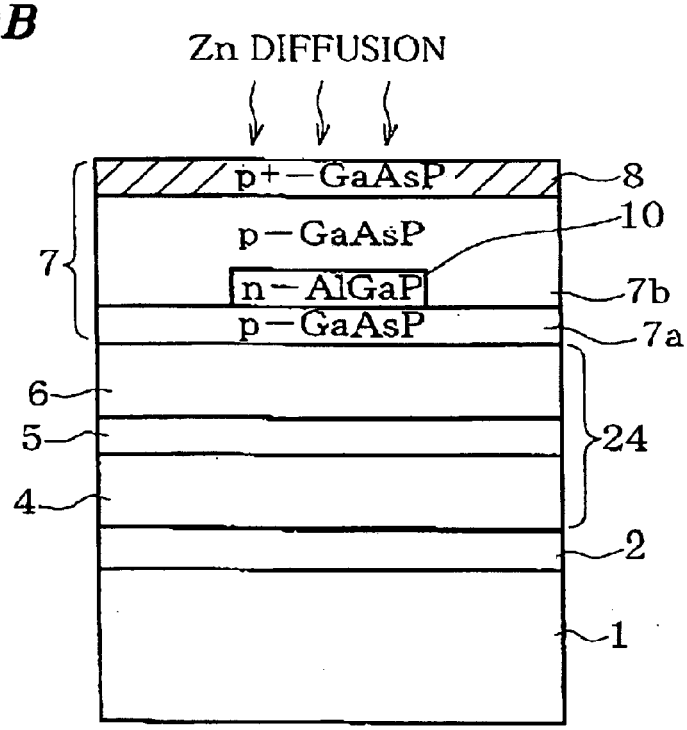
FIG. 10B is an explanatory chart as continued from FIG. 10A.

After the growth of the third layer 7b, the process advances to process step 6' shown in FIG. 10B, where the substrate is transferred into another chamber, heated typically 650 to 750° C. (e.g., 700° C.), supplied with vapor of a Group V element compound ($Zn_3As_2$, $Zn_3P_2$, etc.), and subjected to vacuum diffusion. By this process, Zn component is additionally diffused into the third layer 7b on the electrode forming side, and the high-concentration doped layer 8 is formed. The diffusion time is selected depending on to what thickness $t_2$ the high-concentration doped layer 8 is to be grown. For the case where the current spreading layer is composed of $GaAs_{1-a}P_a$ ($0.5 \leq a \leq 0.9$), the diffusion rate of Zn during the vacuum diffusion for forming the high-concentration doped layer 8 is considerably larger than in GaP at the same temperature. For example, the diffusion time at a process temperature of 650 to 750° C. can be reduced by as much as 30 to 60% as compared with the case using GaP. $GaAs_{1-a}P_a$ is also advantageous in that the growth temperature thereof in the above-described HVPE process can be lowered than that in the MOVPE process. This is successful in more efficiently suppressing nonconformities such that the p-type dopant (Zn for example) excessively diffuses towards the light emitting layer portion side, or that the p-type dopant contained in the p-type cladding layer 6 in the light emitting layer portion 24 diffuses into the active layer 5, during the growth of the current spreading layer composed of p-type $GaAs_{1-a}P_a$ by the HVPE process Selection of at least either of Mg and C, having a relatively small coefficient of diffusion, as the p-type dopant used for the p-type cladding layer 6 is beneficial, because such p-type dopant is less likely to diffuse from the p-type cladding layer 6 towards the active layer 5 even under heating at the growth temperature during formation of the current spreading layer 7 by the HVPE process. This improves the emission intensity. Although the conventional LPE process tends to cause compositional variation in the current spreading layer 7 composed of GaAsP within a single production lot or over the plurality of production lots, adoption of the HVPE process such as in the third invention is beneficial in suppressing by far such compositional variation as compared with the LPE process. The process steps thereafter are same with those described for the first embodiment.

Figure 11:
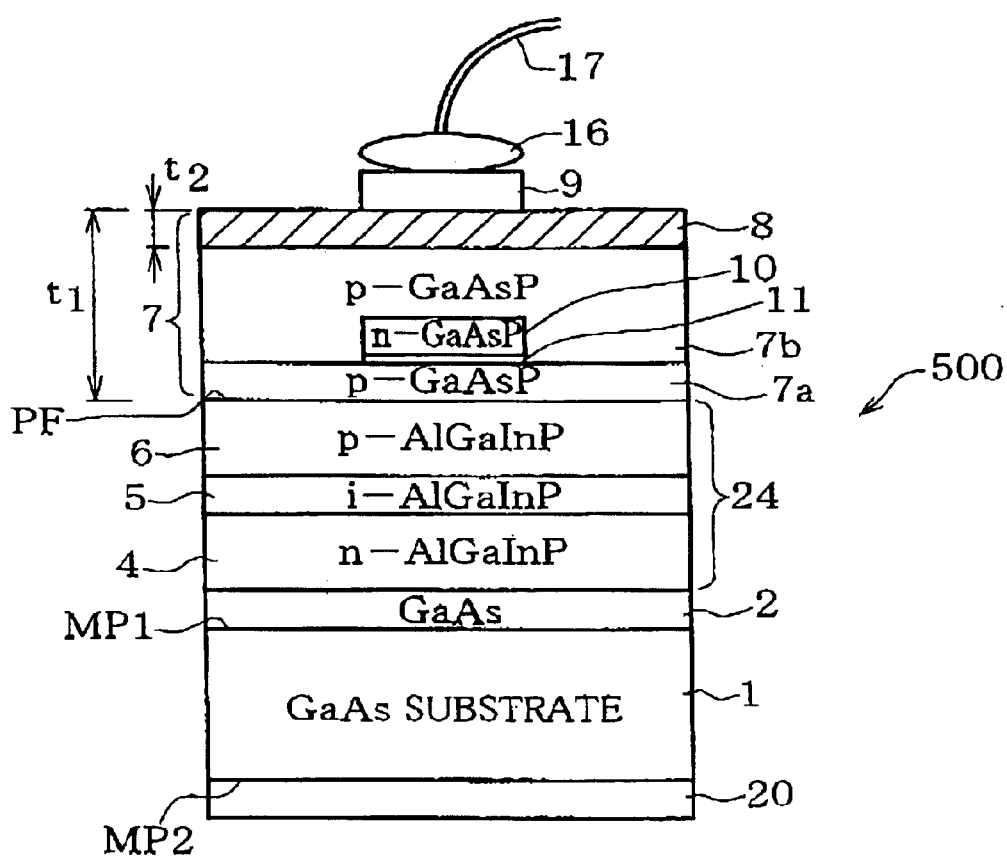
FIG. 11 is a schematic view of a first modified example of the light emitting device shown in FIG. 8.
Figure 12A:
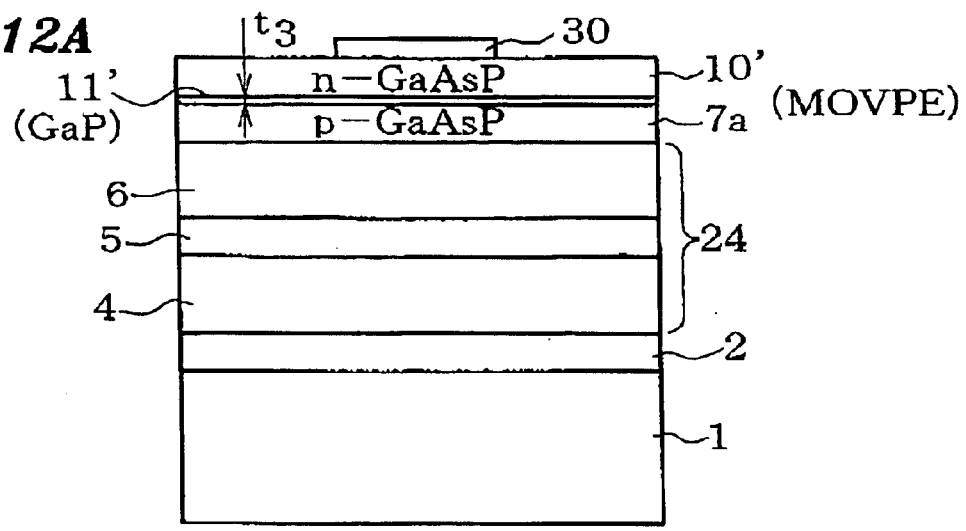
FIG. 12A is a explanatory chart showing a process step of fabricating the light emitting device shown in FIG. 11, while focusing differences from the steps shown in FIGS. 9A and 9B.
Figure 12B:
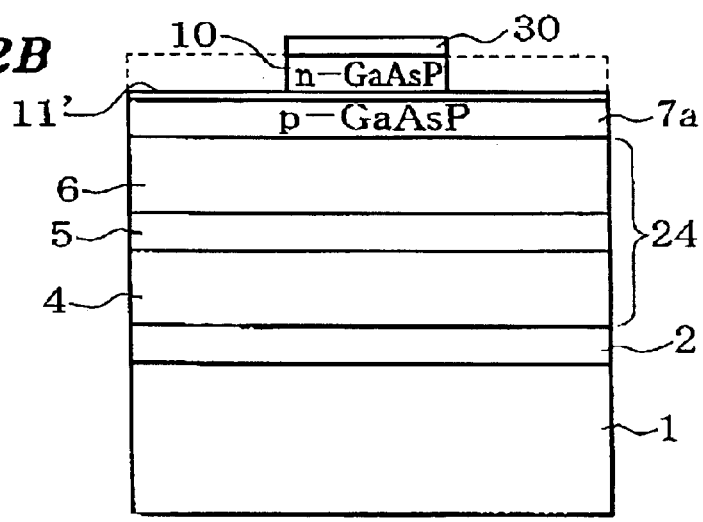
FIG. 12B is an explanatory chart as continued from FIG. 12A.
Figure 12C:
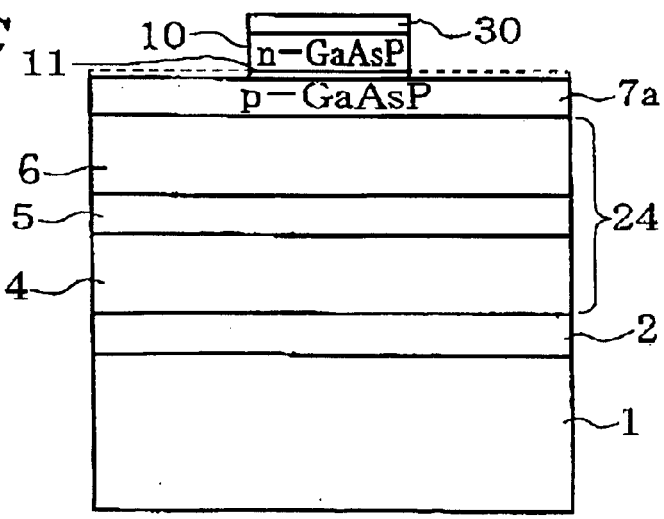
FIG. 12C is an explanatory chart as continued from FIG. 12B.

Next paragraphs will describe various modified examples of the light emitting device 400. A light emitting device 500 shown in FIG. 11 is such that the current blocking layer 10 is composed of $GaAs_{1-a}P_a$ ($0.5 \leq a \leq 0.9$; n-type), which is the same material with that forming the first layer 7a and third layer 7b composing the current spreading layer 7. In this case, the process steps shown in FIGS. 3A and 3B are altered to those shown in FIGS. 12A through 12C. More specifically, as shown in FIG. 12A for process step 7, a fourth layer 11' composed of GaP is formed as an etch stop layer, and then as shown in FIG. 12B for process step 8, the second layer 10', which is to be processed to the current blocking layer 10, composed of $GaAs_{1-a}P_a$ ($0.5 \leq a \leq 0.9$) is selectively etched using a mixed solution of sulfuric acid and hydrogen peroxide. Further in process step 9 shown in FIG. 12C, the portion of the fourth layer 11' exposed out from the current blocking layer 10 is removed by etching. The fourth layer 11 directly under the current blocking layer 10 remains unetched. The process steps thereafter are same with those illustrated in FIGS. 4A and 4B. It is to be noted now that this modified example can also be understood as a modified example of the first and second inventions.

Figure 13:
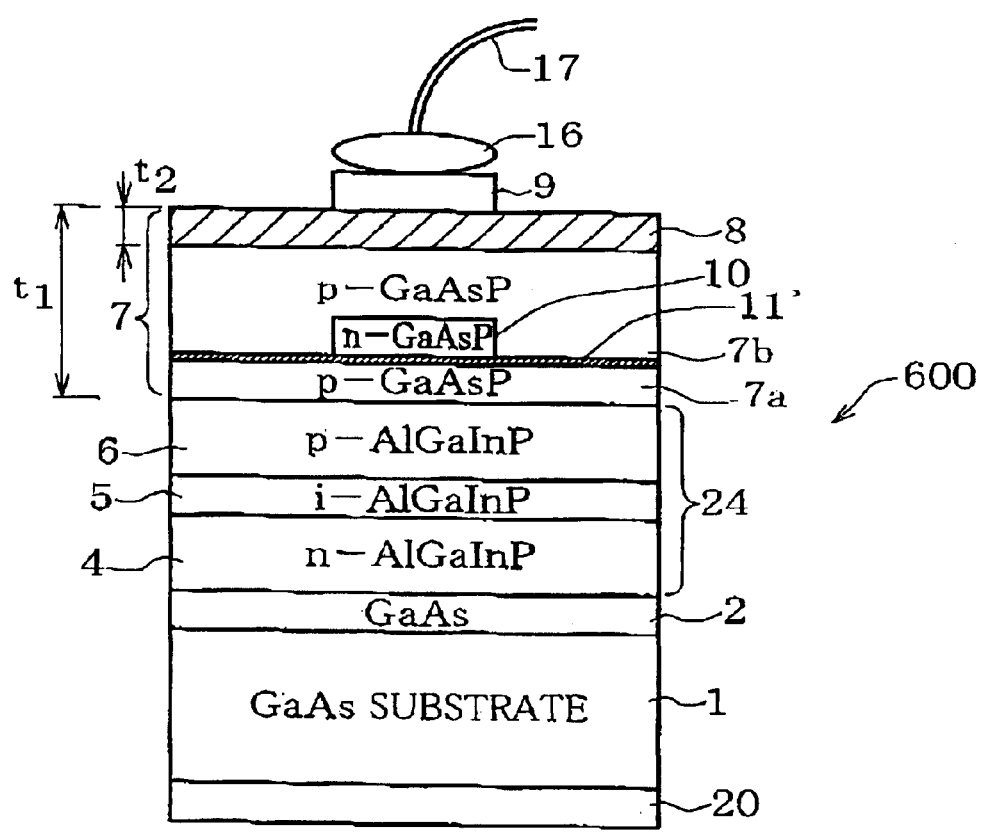
FIG. 13 is a schematic view of a second modified example of the light emitting device shown in FIG. 8.

It is also allowable to leave the fourth layer 11' unetched if the thickness thereof is as small as 1 nm to 50 nm, and as exemplified by light emitting device 600 shown in FIG. 13, the third layer 7b can be formed without removing the portion of the fourth layer 11' exposed out from the current blocking layer 10 (second layer). In this case, the fourth layer 11' resides between the first layer 7a and third layer 7b also in the outside area around the current blocking layer 10. Formation of such extremely thin fourth layer 11' successfully reduces influences of discontinuous energy bands, and ensures current supply to the light emitting layer portion 24 without any problem. It is of course advantageous in simplifying the fabrication process since etching of the fourth layer 11' is omissible. It is to be noted now that this modified example can also be understood as a modified example of the first or second invention.

Figure 14:
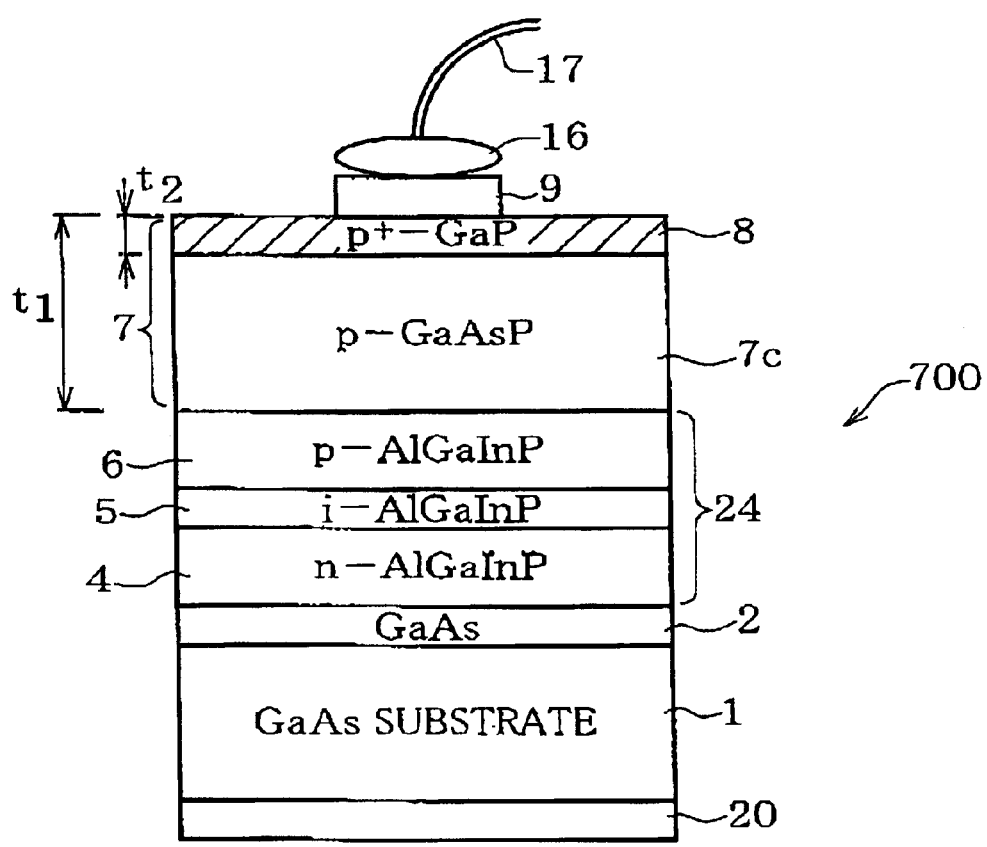
FIG. 14 is a schematic view of a third modified example of the light emitting device shown in FIG. 8.

A light emitting; device 700 shown in FIG. 14 has a constitution from which the current blocking layer is omitted. Also in this case, it is preferable to form a portion 7p of the current spreading layer 7 in contact with the light emitting layer portion 24 with an MO layer portion formed by the MOVPE process, and to form the residual portion of the current spreading layer 7 with an HVPE layer portion formed by the HVPE process. It is to be noted now that this modified example can also be understood as a modified example of the first invention.

Third Embodiment

Figure 15:
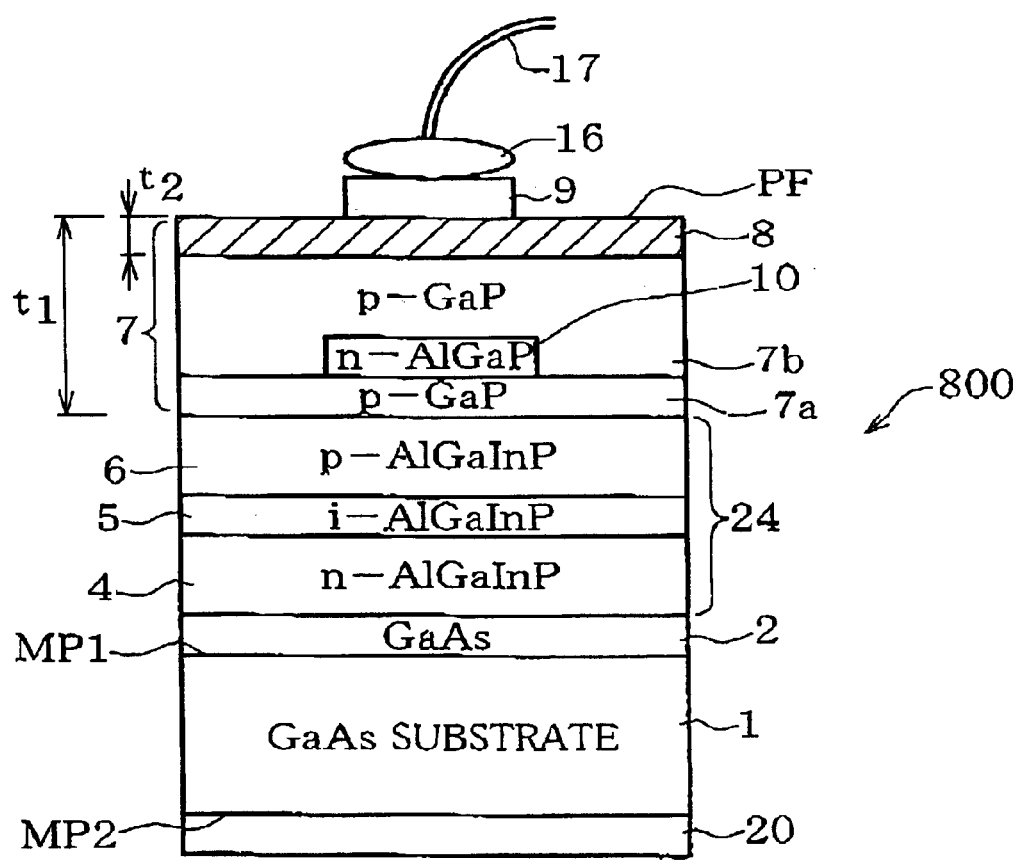
FIG. 15 is a schematic view of a stacked structure of an exemplary light emitting device of the fourth invention.
Figure 16:
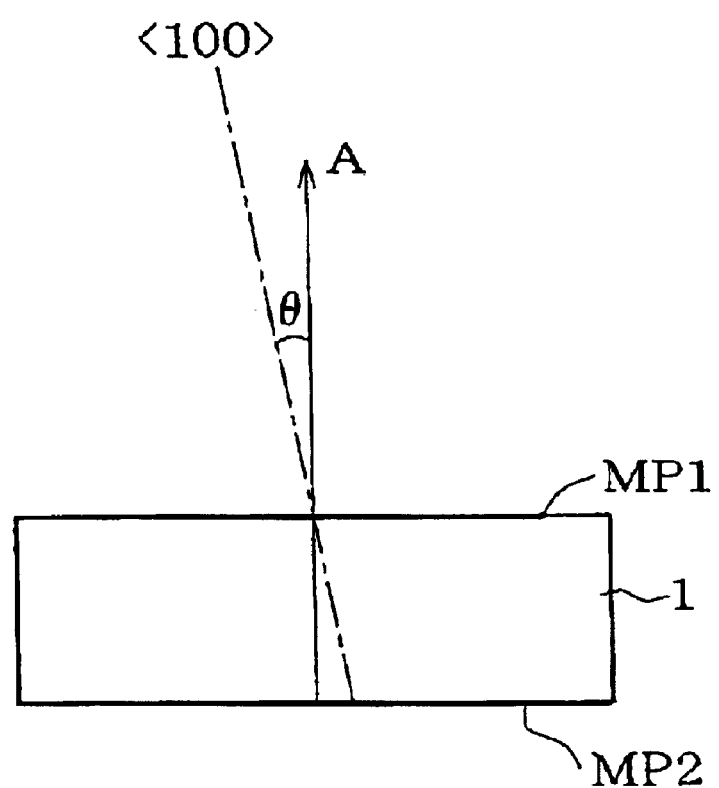
FIG. 16 is a conceptual chart of an off-angled substrate.
Figure 17:
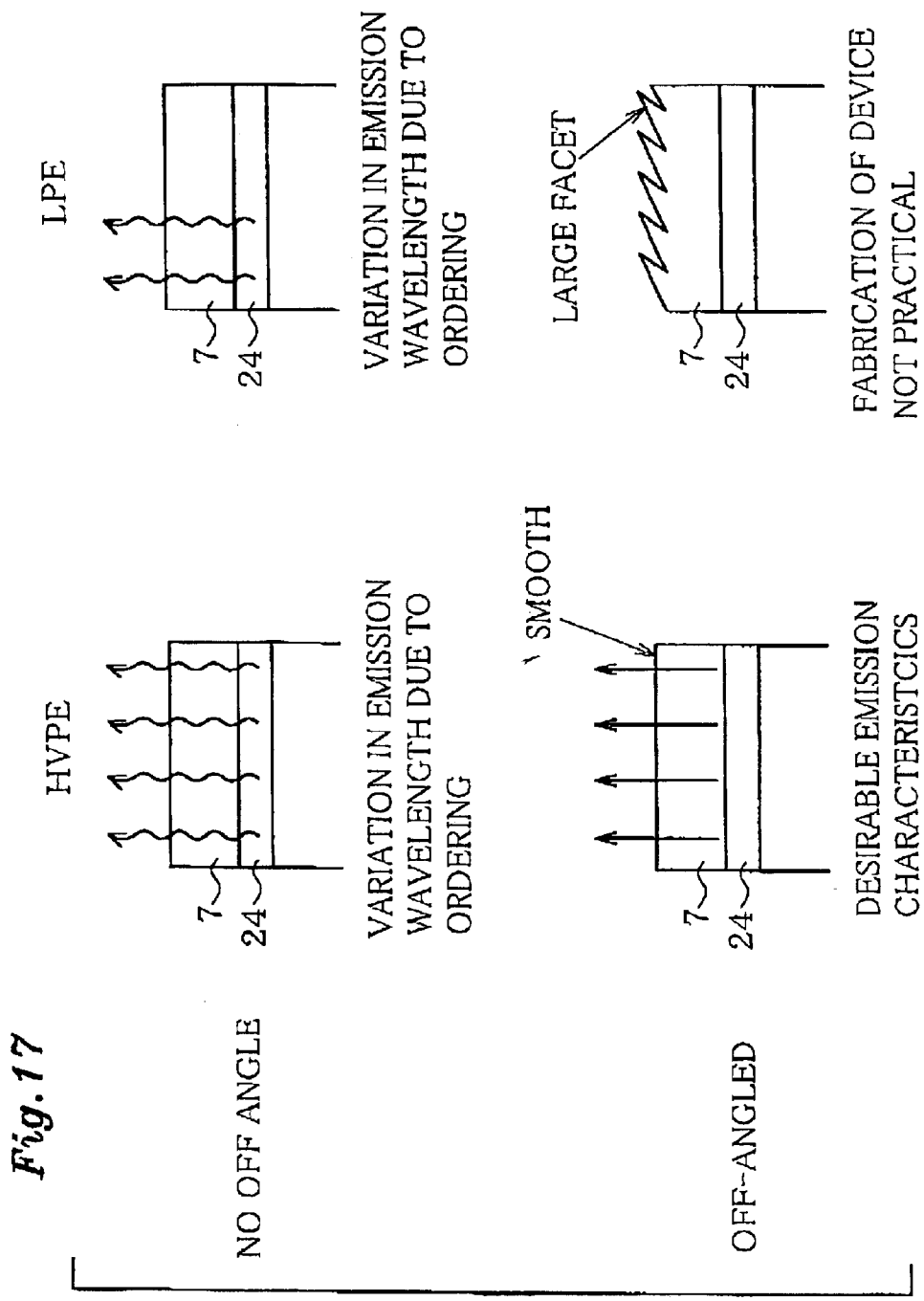
FIG. 17 is a schematic view for explaining difference between the HVPE process and LPE process depending on presence or absence of off-angle of single crystal substrate.

The third embodiment herein shows an exemplary preferable embodiment of the fourth invention. FIG. 15 is a schematic view of a light emitting device 800 according to the fourth embodiment of the invention. The following description will mainly deal with only points differed from those of the light emitting device 100 previously shown in FIG. 1, and any common points therewith will not be detailed. In the light emitting device 800, the substrate 1 is such as having the main axis "A" tilted by an angle within a range from 1° to 25° with respect to the <100> direction (where, the main axis "A" may also be such as being tilted by the same degrees of angle with respect to the <111> direction). The process steps for fabricating the device 800 are totally the same with those shown in FIGS. 2A through 4B except using off-angled, GaAs single crystal substrate 1. As previously described referring to FIG. 17, formation of the current spreading layer 7 by the HVPE process is successful in obtaining an excellently smooth surface despite the substrate 1 is off-angled. The thickness $t_1$ of the current spreading layer 7 typically falls within a range from 5 μm to 200 μm (50 μm, for example). The thickness of the current blocking layer 10 typically falls within a range from 0.05 μm to 1 μm (0.1 μm, for example).

Using the GaAs single crystal substrate having the main axis tilted by 10° to 20° (preferably 13° to 17°) is effective in suppressing generation of the large-amplitude, projection-like crystal defects on the surface of the current spreading layer 7, successfully lowers the appropriate growth temperature of the current spreading layer 7 in the HVPE process to as low as 640° C. to 750° C. (more preferably 680° C. to 720° C.) which is advantageous in obtaining the smooth surface status, desirably suppresses diffusion of dopants from the p-type cladding layer 6 and n-type cladding layer 4 towards the active layer 5, and consequently suppresses degradation of the dopant profile of the light emitting layer portion 24 possibly caused by the diffusion.

Figure 18:
FIG. 18 is a photograph showing an outer appearance of a light emitting device having the current spreading layer formed on an off-angled substrate by the HVPE process.
Figure 19:
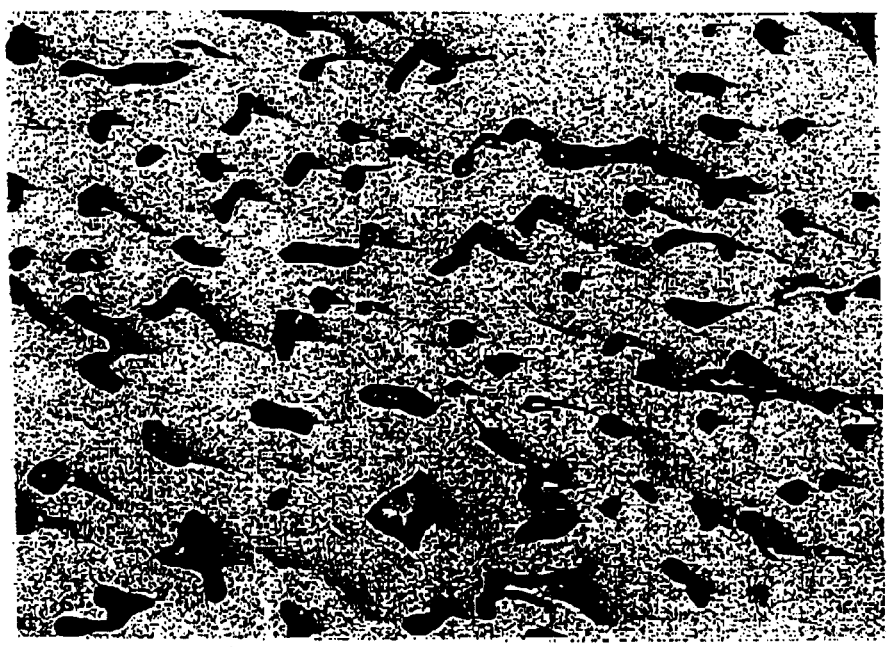
FIG. 19 is a photograph showing an outer appearance of a light emitting device having the current spreading layer formed on an off-angled substrate by the LPE process.

FIG. 18 shows the surface of the current spreading layer 7 of a light emitting device in which the GaAs single crystal substrate 1 has the main axis tilted by 2° with respect to the <100> direction, and thereon the light emitting layer portion 24 having a stacked structure same as that previously shown in FIG. 15 and the first layer 7a of the current spreading layer 7 are formed by the MOVPE process, and the third layer 7b of the current spreading layer 7 is formed by the HVPE process. It is found that the desirable surface profile is obtained. On the contrary, FIG. 19 shows the surface of the current spreading layer 7 of a light emitting device in which the third layer 7b of the current spreading layer 7 is formed by the LPE process. The photograph showed a large irregularity ascribable to the facet, indicating that it is substantially impossible to fabricate the element by forming an electrode on such surface.

Next, on the substrate before dicing, the individual layers for composing the light emitting device 800 shown in FIG. 15 were formed so as to have thickness listed below. The GaAs single crystal substrates used herein were such as having the major axes tilted by various angles within a range from 2° to 20° with respect to the <100> direction.

p-type AlGaInP cladding layer 6: 1 µm (Mg doping concentration: $1 \times 10^{17}$ to $3 \times 10^{17}/cm^3$)

AlGaInP active layer 5: 0.6 µm (emission wavelength: 650 nm), (non-doped);

n-type AlGaInP cladding layer 4: 1 µm (Si doping concentration: $4 \times 10^{17}$ to $10 \times 10^{17}/cm^3$);

current spreading layer 7: 5 to 50 µm: and current blocking layer 10: 0.1 µm.

The thickness of the current spreading layer 7 formed by the HVPE process was set to various values within a range from 5 µm to 50 µm, and the growth temperature was set to various values within a range from 640° C. to 840° C. The obtained substrate was observed for the surface of the current spreading layer 7 under an optical microscope, and the number per unit area of coarse projection-like crystal defects having a planar outer diameter of 20 µm or more was counted and summarized in Table 1 below (conditions for the judgment are given in the footnote of Table 1).

TABLE 1

| Angle of tilt | Growth temperature (° C.) | | | | |
|---|---|---|---|---|---|
| (°) | 840 | 790 | 740 | 690 | 640 |
| 2 | ⊚ | ○ | X | X | X |
| 5 | ⊚ | ⊚ | ○ | Δ | X |
| 10 | ⊚ | ⊚ | ⊚ | ○ | Δ |
| 15 | ⊚ | ⊚ | ⊚ | ⊚ | Δ |
| 20 | ⊚ | ⊚ | ⊚ | ○ | Δ |

Count of projection-like crystal defects
⊚: less than 3/cm²;
○: 3/cm² or more and less than 10/cm²;
Δ: 10/cm² or more and less than 20/cm²; and
X: 20/cm² or more.

Figure 20:
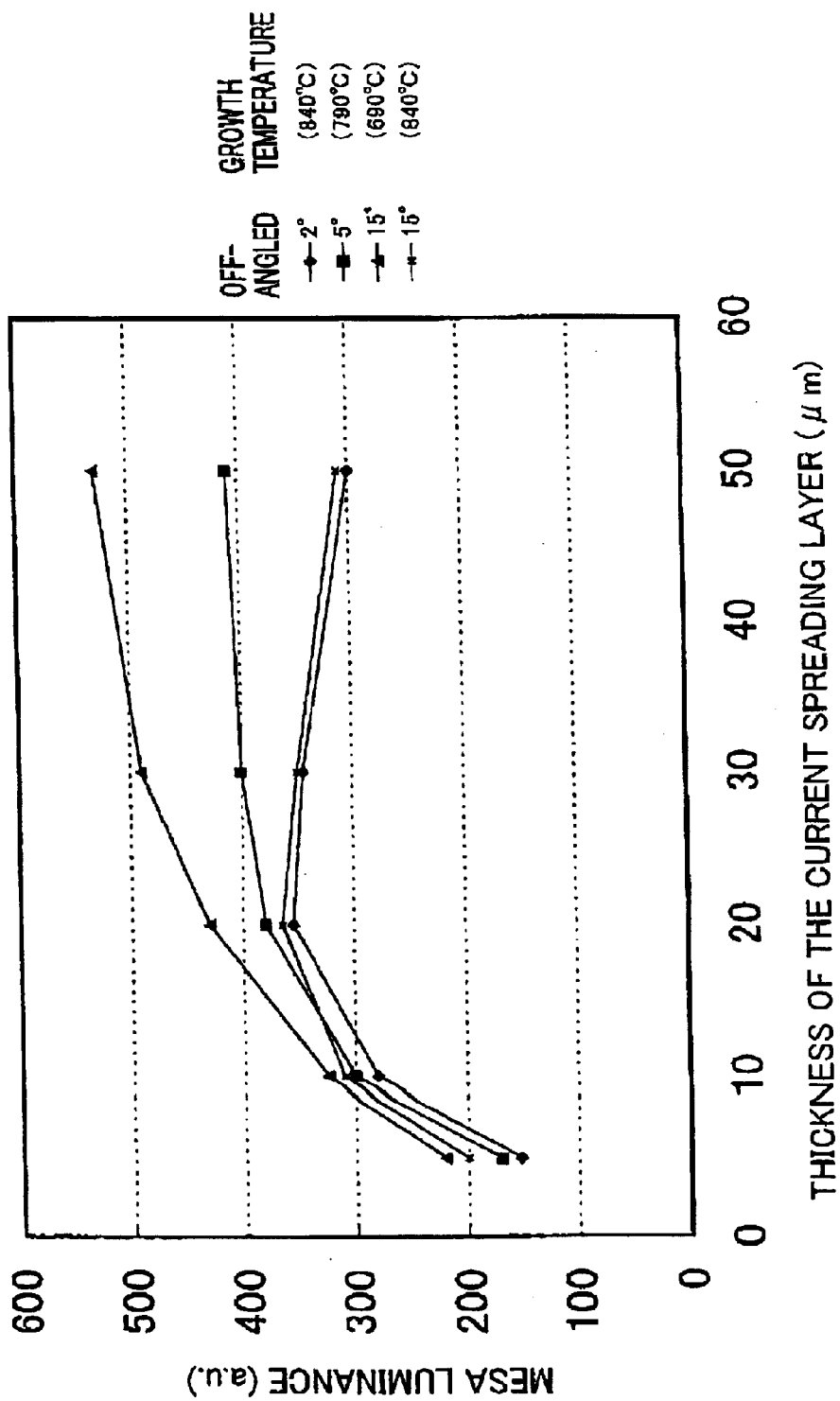
FIG. 20 is a graph showing results of measurement of relation between mesa luminance and thickness of the current spreading layer under various off-angled conditions of GaAs single crystal substrate.

It is known from the above results that angle of tilt within 10° to 20° was successful in distinctively reducing the number of generated projection-like crystal defects on the surface of the current spreading layer 7 even when the growth temperature of the current spreading layer 7 was set to relatively as low as 790° C. or below, and in obtaining a smooth and desirable surface. In particular for the case where the angle of tilt was set to 15°, which fell within a range from 13° to 17°, it was found that the suppressive effect against generation of the projection-like crystal defects was not largely ruined even if the growth temperature of the current spreading layer 7 was lowered to as low as 690° C. to 640° C. FIG. 20 is a graph showing measured results of the mesa luminance (see Japanese Laid-Open Patent Publication No 51-144185) of the light emitting layer portion 24 when the GaP current spreading layer 7 was grown under various off-angled conditions at the lowermost temperatures allowing the surface status of the current spreading layer to be optimized, by the HVPE process so as to have various thickness. The mesa luminance generally increased with increase in the thickness of the current spreading layer 7 because the current was more likely to spread within the plane, and was uniformly supplied to the light emitting layer portion 24. The current spreading layer having a certain level of thickness, however, resulted in increased duration of time during which the light emitting layer portion 24 was exposed to heat history during the growth of the current spreading layer, so that degradation of the dopant profile due to diffusion proceeded so as to decelerate increasing tendency of the mesa luminance. Referring now to FIG. 20, under an off-angled condition of 15°, the lowermost temperature allowing the surface status of the current spreading layer 7 to be optimized was 690° C., and this was found to be lower by as much as 150° C. than the lowermost temperature of 840° C. under an off-angled condition of 2°, as obvious from Table 1. As a consequence, the rate of increase in the mesa luminance relative to the thickness of the current spreading layer 7 did not fall so sharply, and it was found in particular for the case where the current spreading layer 7 had a thickness of 25 µm or above, that a relative mesa luminance increased by as much as 10 to 40% or around as compared with the case under an off-angled condition of 2°. FIG. 20 also shows a comparative case in which the growth temperature was set to 890° C. under an off-angled condition of 15°, where it was found that rate of increase in the mesa luminance relative to the thickness of the current spreading layer fell to a considerable degree. It was thus found that the reason why a desirable result was obtained at a growth temperature of 690° C. under an off-angled condition of 15° was that the lowering of the growth temperature successfully prevented the dopant profile from being degraded due to diffusion.

Figure 5:
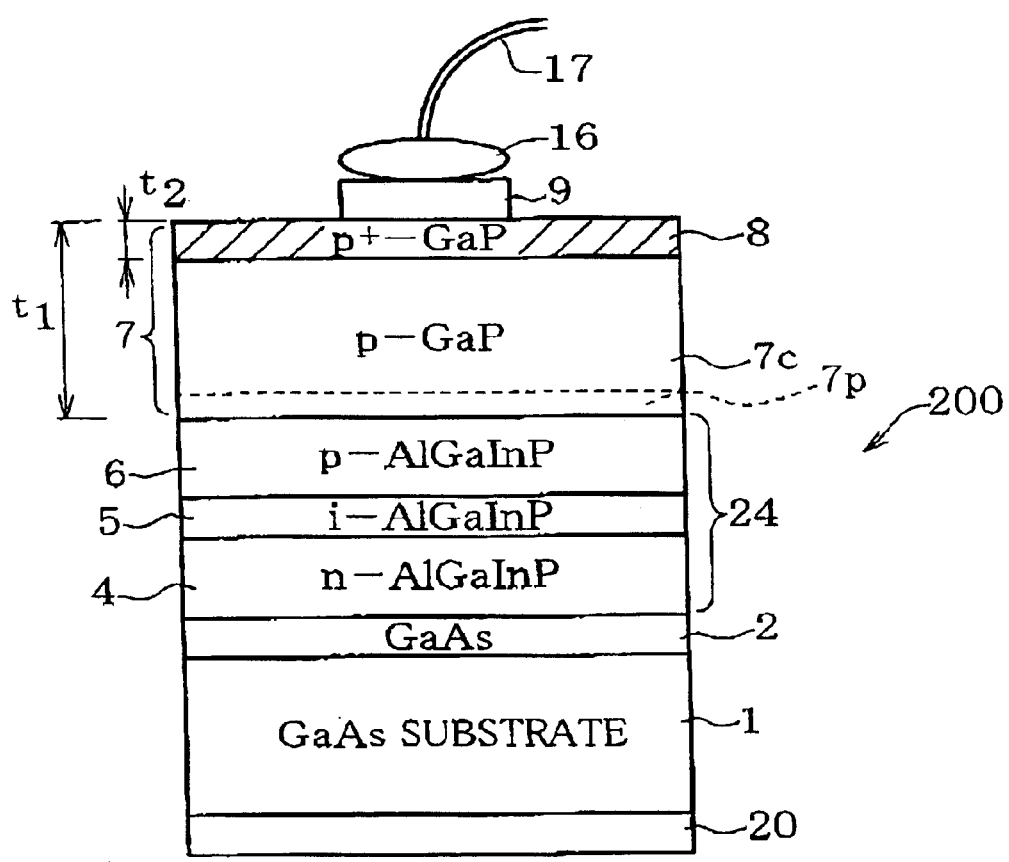
FIG. 5 is a schematic view of a first modified example of the light emitting device shown in FIG. 15.
Figure 6:
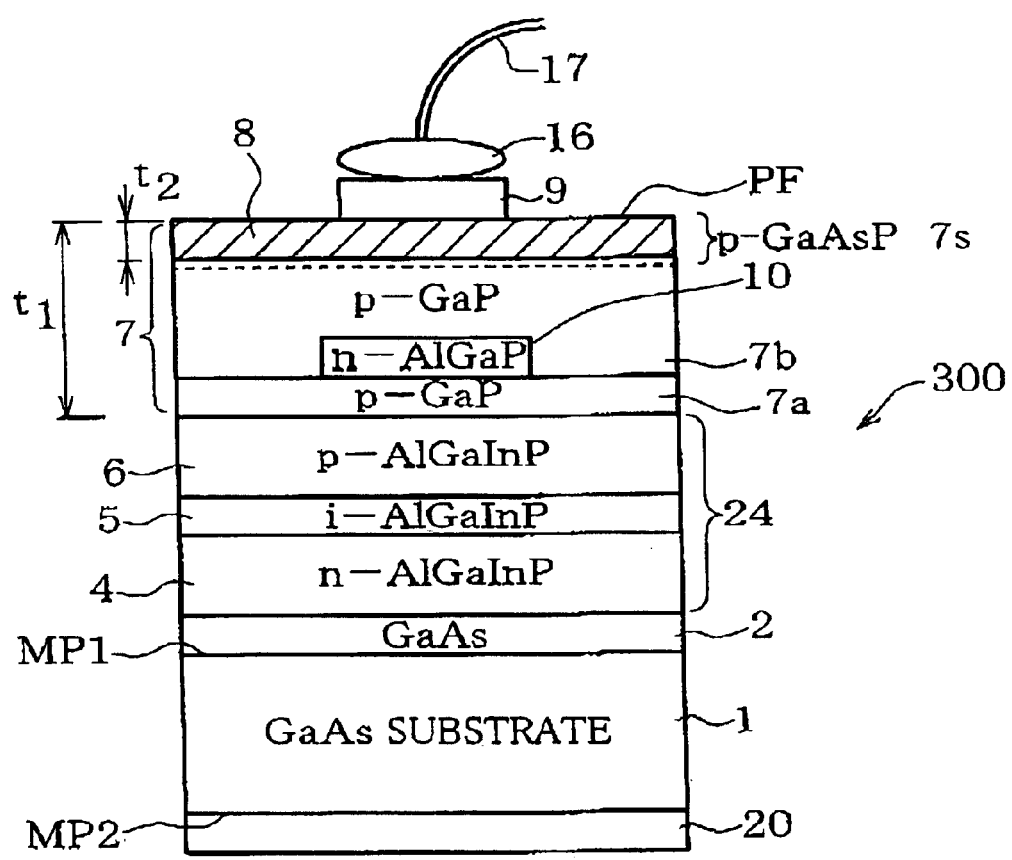
FIG. 6 is a schematic view of a second modified example of the light emitting device shown in FIG. 15.

Modified examples, applicable to the first through fourth inventions will be describe below For the convenience of explanation, the following description will be made based on the constitution of the light emitting device 800 previously shown in FIG. 15, where the common components are expressed by the same reference numerals without giving detailed explanation, and only different points will be described (FIG. 15 expresses an embodiment of the fourth embodiment but is applicable also to the first, second and third inventions unless otherwise specifically noted). The light emitting device 200 shown in FIG. 5 has a constitution in which the current blocking layer is omitted (except for the second invention in which the current blocking layer is essential). Also in this case, it is preferable to form a portion 7p of the current spreading layer 7 in contact with the light emitting layer portion 24 with an MO layer portion formed by the MOVPE process, and to form the residual portion of the current spreading layer 7 with an HVPE layer portion formed by the HVPE process A light emitting device 300 shown in FIG. 6 has a current spreading layer 7, in which the essential portion of which is composed of GaP, only an electrode forming area in the current spreading layer of which is composed of a GaAsP layer 7s, and has the high-concentration doped layer 8 containing Zn as a dopant in such GaAsP layer 7s, formed by the aforementioned additional diffusion. Because the diffusion speed of Zn is faster in GaAsP than in GaP, the high-concentration doped layer 8 can be formed within a short time. Another advantage is that composition of the current spreading layer 7 can readily be changed (GaP to GaAsP, herein) in the midway of the growth by the HVPE process by altering mixing ratio of the Group V element gas (AsH$_3$ and PH$_3$), which is easier in the LPE process.

While the active layer 5 in all of the aforementioned embodiments was formed by a single layer, it is also allowable to form the active layer 5 with a stack of a plurality of compound semiconductor layers differing in the band gap energy, more specifically, with a quantum well structure (the same will apply also to the third invention and thereafter). The active layer having a quantum well structure is obtained by stacking two layers having the alloy composition controlled to have different band gap energies, which are a well layer having a smaller band gap energy and a barrier layer having a larger band gap energy, and individually having a thickness equals to or smaller than the mean free path of electron (generally monoatomic layer to several nanometers), so as to establish a lattice matching. For the case where the invention is applied, for example, to semiconductor laser devices, the above-described structure allows arbitrary adjustment of oscillation wavelength depending on the width or depth of the energy well layer because the energy of electrons (or holes) within the quantum well layer in such structure are quantized, and the structure is also advantageous in raising the emission efficiency, and in reducing the oscillation threshold current density. Mismatching of the lattice constants up to as much as 2 to 3% or around may be allowable between the well layer and barrier layer since these layers are extremely thin, and thus the oscillation wavelength can readily be expanded. The quantum well structure may be a multiple quantum well structure having a plurality of well layers, or may be a single quantum well structure having only one well layer. The thickness of the barrier layer may be 50 nm or around only for that in contact with the cladding layer, and may be 6 nm or around for the others. The thickness of the well layer may be 5 nm or around.

While the light emitting layer 24 in the above embodiments was formed on the substrate 1 while placing the buffer layer 2 in between, it is also allowable to dispose a reflective layer for raising the light extraction efficiency. The reflective layer may be such as stacking a plurality of semiconductor layers having different refractive indices, as disclosed in Japanese Laid-Open Patent Publication No. 7-66455 (U.S. Pat. No 5,442,203).

Figure 21:
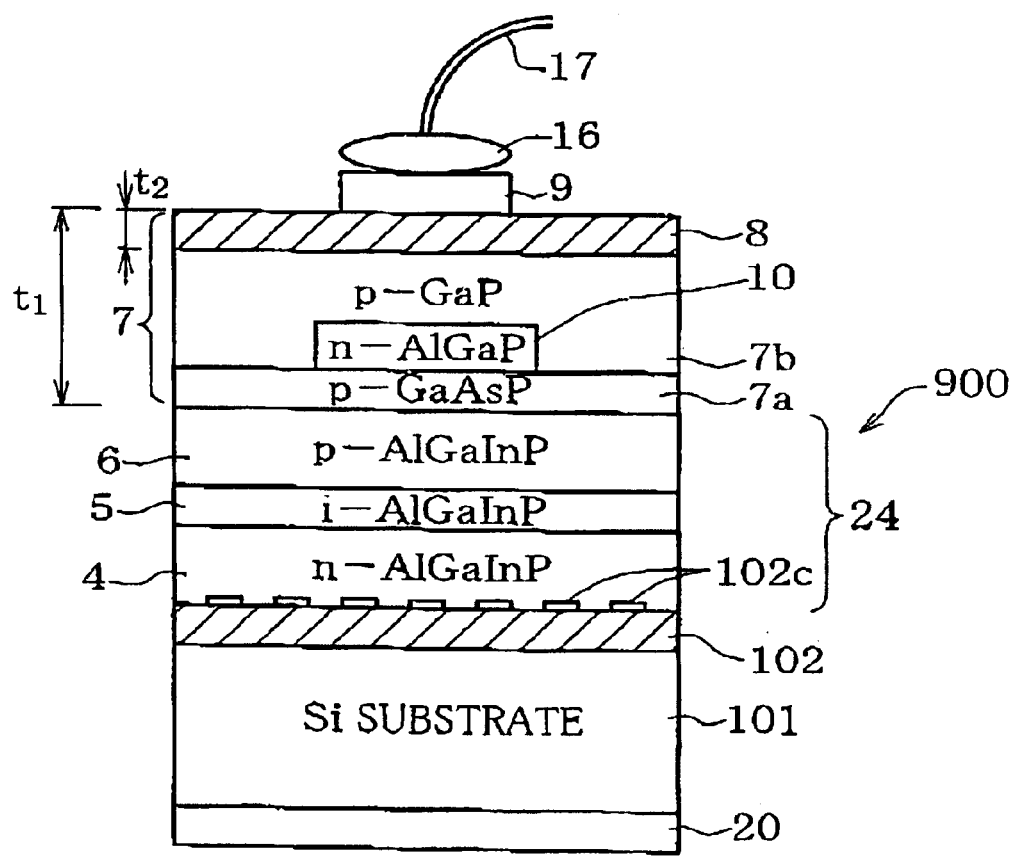
FIG. 21 is a schematic sectional view showing a third modified example of the light emitting device shown in FIG. 15.
Figure 22:
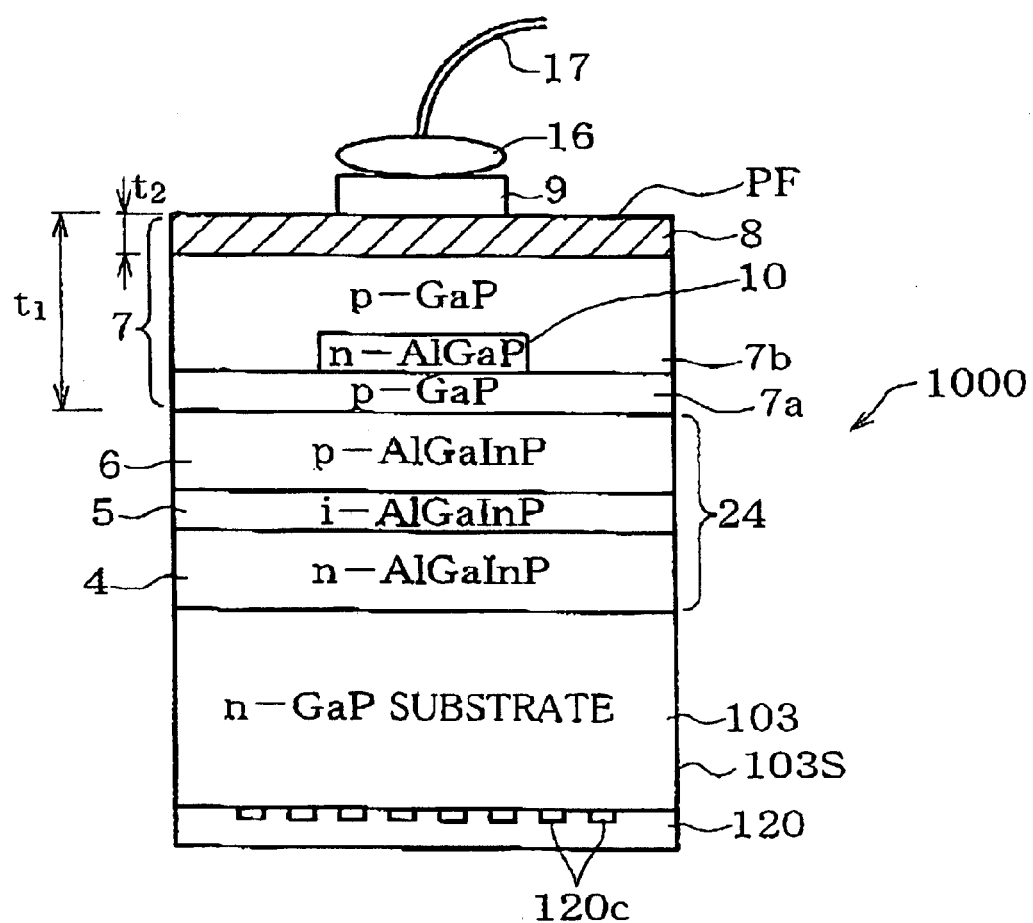
FIG. 22 is a schematic sectional view showing a fourth modified example of the light emitting device shown in FIG. 15.

A light emitting device 900 shown in FIG. 21 is configured so that the Gabs single crystal substrate 1 of the light emitting device 800 shown in FIG. 15 is removed typically by etching, and instead an Si substrate 101 which is a conductive substrate (use of a metal plate such as an Al plate also allowable) is bonded while placing a metal layer 102 (typically comprising an Au layer or Ag layer) in between. Between the metal layer 102 and the light emitting layer portion 24, a contact layer 102c is formed in a discrete manner (while an AuBe layer is formed herein in contact with the n-type layer 4 in this embodiment, it is allowable to use an AuGeNi layer when a p-type layer comes into contact). Particularly large reflective effect by virtue of the metal layer 102 can be obtained in the area having no contact layer 102c formed therein A light emitting device 1000 shown in FIG. 22 is configured so that the GaAs single crystal substrate 1 of the light emitting device 800 shown in FIG. 8 is removed typically by etching, ant instead a GaP substrate 103 which is a transparent conductive substrate (n-type in this embodiment) is bonded. Light can be extracted from the side face 103S of the GaP substrate 103. In the embodiment, the contact layer 102c is formed in a discrete manner on the back surface of the GaP substrate 103, and the contact layer 102c, together with the area having no contact layer 102c formed therein, is covered with an electrode 120 (an Au electrode, for example) for applying emission drive voltage to the light emitting layer portion 24 (formation of an Ag paste layer in place of the electrode 120 also allowable).

Figure 23:
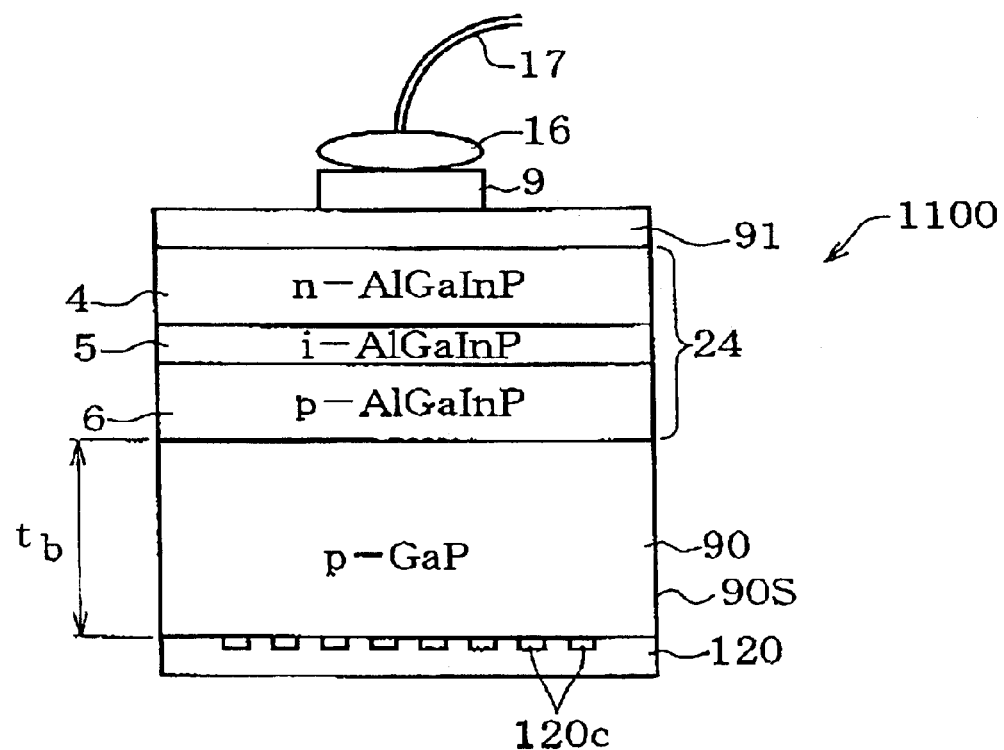
FIG. 23 is a schematic sectional view showing a fifth modified example of the light emitting device shown in FIG. 15.

A light emitting device 1100 shown in FIG. 23 is configured so that a thick current spreading layer 90 also serves as the substrate for the device is grown on the back surface of the light emitting layer portion 24 (order of stacking of the n-type cladding layer 4, the active layer 5 and the p-type cladding layer 6 is inverted). The current spreading layer 90 herein is a p-type GaP layer epitaxially grown by the HVPE process, where the thickness $t_b$ thereof falls within a range from 50 μm to 200 μm (100 μm, for example). GaP is transparent to the flux of light emitted from the light emitting layer portion 24, and thus the light can be extracted also from the side face 90s thereof In the embodiment, a transparent contact-forming conductive layer 91 is formed on the light-extraction side (p-type cladding layer 6 side) of the light emitting layer portion 24, and on such contact-forming conductive layer 91, the electrode 9 and the bonding pad 16 are formed. The contact-forming conductive layer 91 is typically composed of GaP, GaAsP, AlGaAs, AlGaInP and so forth, where it is also allowable to use conductive oxides.

In a typical fabrication process of the light emitting device 1100 shown in FIG. 23, after completion of step 2 in FIG. 2, the current spreading layer 90 can be formed directly on the main surface of the light emitting layer portion 24 on the side opposite to the GaAs substrate 1 (p-type cladding layer 6 side) by the HVPE process. The GaAs substrate 1 is then removed, and the contact-forming conductive layer 91 can be formed on the main surface of the light emitting layer portion 24 on the side from which the substrate 1 has been removed (n-type cladding layer 4 side) by epitaxial growth according to the HVPE process (typically for the case where the contact-forming conductive layer 91 is composed of GaP or GaAsP). On the other hand, it is also allowable, for the case where the contact-forming conductive layer 91 is composed of AlGaAs or AlGAInP, that the contact-forming conductive layer 91 is first grown on the GaAs substrate 1 by the MOVPE process, the light emitting layer portion 24 is grown, and the GaAs substrate 1 is then removed. The contact-forming conductive layer 91 composed of AlGaInP may have the same alloy composition as that of the AlGaInP composing the cladding layer on the light emitting layer portion side (n-type cladding layer 4 side in FIG. 23), or may have a different alloy composition. When the same alloy composition is selected, it is preferable to raise the dopant concentration of the contact-forming conductive layer 91 as compared with that of the cladding layer, so as to raise the conductivity. When a different alloy composition is selected, it is preferable to set the alloy composition so as to expand the band gap as compared with that of the active layer 5 of the light emitting layer portion 24, in view of raising the translucence.

In the light emitting device 1000 shown in FIG. 22 and the light emitting device 1100 shown in FIG. 23, the contact layer 120c (an AuBe layer in contact with the n-type GaP substrate 103 in FIG. 22, and an AuGeNi layer in contact with the current spreading layer 90 comprising p-type GaP in FIG. 23) is formed in a discrete manner on the back surface of the GaP substrate 103 or current spreading layer 90. In this embodiment, the contact layer 120c, together with the area having no contact layer 120c formed therein, is covered with the electrode 120 (an Au electrode, for example) for applying emission drive voltage to the light emitting layer portion 24 (formation of an Ag paste layer in place of the electrode 120 also allowable). According to the constitution, the reflective effect by the metal electrode can be raised in the area having no contact layer 120c formed therein.

What is claimed is:

1. A method of fabricating a light emitting device in which a light emitting layer portion and a current spreading layer respectively composed of a Group III-V compound semiconductor, and an electrode for applying light emission drive voltage to the light emitting layer portion, are once stacked in this order on a single crystal substrate, the method comprising:

a first vapor-phase growth step for forming the light emitting layer portion on the single crystal substrate by the metal organic vapor-phase epitaxy process;

a second vapor-phase growth step, carried out after the light emitting layer portion was formed, for forming the p-type current spreading layer based on the hydride vapor-phase epitaxy process; and a high-concentration doped layer forming step for forming a high-concentration doped layer in a surficial area including the main surface on the electrode forming side of the current spreading layer, so as to have a carrier concentration of p-type dopant higher than that in the residual portion of the current spreading layer.

2. The method of fabricating a light emitting device as claimed in claim 1, wherein in the second vapor-phase growth step the current spreading layer is formed by supplying a dopant gas together with a source gas for the Group III-V compound semiconductor;

and after the second vapor-phase growth step, the dopant is additionally diffused from the surficial portion of the current spreading layer to thereby form the high-concentration doped layer.

3. The method of fabricating a light emitting device as claimed in claim 1, wherein the current spreading layer is formed, using at least either of Zn and Mg as the dopant, as a p-type $GaAs_{1-a}P_a$ ($0 \leq a \leq 1$) layer having a band gap energy larger than an optical energy corresponded to the peak emission wavelength of the light emitting layer portion.

4. The method of fabricating a light emitting device as claimed in claim 3, wherein the carrier concentration of the dopant is adjusted within a range from $2 \times 10^{18}/cm^3$ to $5 \times 10^{19}/cm^3$ for the high-concentration doped layer, and from $1 \times 10^{17}/cm^3$ $2 \times 10^{18}/cm^3$ for the residual portion.

5. The method of fabricating a light emitting device as claimed in claim 1, wherein in the second vapor-phase growth step the thickness of the current spreading layer is adjusted within a range from 5 μm to 20 μm, and the thickness of the high-concentration doped layer is adjusted within a range from 1 μm to 4 μm.

6. The method of fabricating a light emitting device as claimed in claim 1, wherein the current spreading layer is designed to have a portion on the electrode forming side a high-GaAs-alloy-composition $GaAs_{1-a}P_a$ ($0 \leq a < 1$) layer having a GaAs alloy composition 1-a larger than that in the residual portion, and to have the high-concentration doped layer, containing Zn as the dopant, formed in the high-GaAs-alloy-composition $GaAs_{1-a}P_a$ layer.

7. The method of fabricating a light emitting device as claimed in claim 1, wherein the light emitting layer portion has a double heterostructure in which a first-conductivity-type cladding layer, an active layer and a second-conductivity-type cladding layer, all of which being composed of $(Al_xGa_{1-x})_yIn_{1-y}P$ (where, $0 \leq x \leq 1$ and $0 \leq y \leq 1$), are stacked in this order as viewed from the electrode side.

8. The method of fabricating a light emitting device as claimed in claim 7, wherein the first-conductivity-type cladding layer is composed of p-type $(Al_xGa_{1-x})_yIn_{1-y}P$.

9. The method of fabricating a light emitting device as claimed in claim 8, wherein the p-type dopant used for the first-conductivity-type cladding layer is at least either of Mg and C.

10. The method of fabricating a light emitting device as claimed in claim 1, wherein the current spreading layer and a portion of the light emitting layer portion in contact with the current spreading layer are composed of Group III-V compound semiconductors differing from each other in the lattice constants, and the current spreading layer has an MO layer portion formed by the metal organic vapor-phase epitaxy process in a portion in contact with the light emitting layer portion, and has an HVPE layer portion formed by the hydride vapor-phase epitaxy process in the residual portion.

11. A method of fabricating a light emitting device in which a light emitting layer portion and a current spreading layer respectively composed of a Group III-V compound semiconductor, and an electrode for applying light emission drive voltage to the light emitting layer portion, are once stacked in this order on a single crystal substrate, the method comprising:

a first vapor-phase growth step for forming the light emitting layer portion on the single crystal substrate by the metal organic vapor-phase epitaxy process;

a second vapor-phase growth step, carried out after the light emitting layer portion was formed, for forming the current spreading layer based on the hydride vapor-phase epitaxy process; and a current blocking layer forming step for forming a current blocking layer which comprises a Group III-V compound semiconductor having a conductivity type different from that of the current spreading layer, as being buried in the current spreading layer; wherein
   at least a portion of the current spreading layer covering the current blocking layer on the electrode side is formed by the hydride vapor-phase epitaxy process.

12. The method of fabricating a light emitting device as claimed in claim 11, wherein the current blocking layer is composed of an Al-free, Group III-V compound semiconductor.

13. The method of fabricating a light emitting device as claimed in claim 11, wherein the current blocking layer forming step further comprises:

a third vapor-phase growth step for forming a first layer which composes a part of the current spreading layer and is composed of a first-conductivity-type Group III-V compound semiconductor, and a second layer which composes the current blocking layer and is composed of a second-conductivity-type Group III-V compound semiconductor, sequentially on the light emitting layer portion by the metal organic vapor-phase epitaxy process; and an etching step for removing an unnecessary portion of thus-obtained second-conductivity-type compound semiconductor layer so as to leave a portion to be the current blocking layer; and the second vapor-phase growth step is to form a third layer which comprises a Group III-V compound semiconductor having a conductivity type same as that of the first layer, so as to cover a portion of the second layer left unetched, by the hydride vapor-phase epitaxy process.

14. The method of fabricating a light emitting device as claimed in claim 13, wherein both of the first layer and the second layer are composed of an Al-free, Group III-V compound semiconductors.

15. The method of fabricating a light emitting device as claimed in claim 14, wherein all of the first layer, the second layer and the third layer are composed of $GaAs_{1-a}P_a$ ($0 \leq a \leq 1$).

16. The method of fabricating a light emitting device as claimed in claim 15, wherein a fourth layer is formed between the first layer and the second layer, where the fourth layer being composed of a Group III-V compound semiconductor different from those composing both layers; and in the etching step, the second layer is chemically removed by a selective etching using the fourth layer as an etch stop layer.

17. The method of fabricating a light emitting device as claimed in claim 16, wherein the thickness of the fourth layer is adjusted within a range from 1 nm to 100 nm.

18. The method of fabricating a light emitting device as claimed in claim 11, wherein the light emitting layer portion has a double heterostructure in which a first-conductivity-type cladding layer, an active layer and a second-conductivity-type cladding layer, all of which being composed of $(Al_xGa_{1-x})_yIn_{1-y}P$ (where, $0 \leq x \leq 1$ and $0 \leq y \leq 1$), are stacked in this order as viewed from the electrode side.

19. A method of fabricating a light emitting device in which a light emitting layer portion and a current spreading layer respectively composed of a Group III-V compound semiconductor, and an electrode for applying light emission drive voltage to the light emitting layer portion, are once stacked in this order on a single crystal substrate, the method comprising:

a first vapor-phase growth step for forming the light emitting layer portion on the single crystal substrate by the metal organic vapor-phase epitaxy process; and a second vapor-phase growth step, carried out after the light emitting layer portion was formed, for forming the current spreading layer composed of $GaAs_{1-a}P_a$ ($0.5 \leq a \leq 0.9$) based on the hydride vapor-phase epitaxy process.

20. The method of fabricating a light emitting device as claimed in claim 19, wherein the current spreading layer is formed, using at least either of Zn and Mg as the dopant, as a p-type $GaAs_{1-a}P_a$ ($0.5 \leq a \leq 0.9$) layer having a band gap energy larger than an optical energy corresponded to the peak emission wavelength of the light emitting layer portion.

21. The method of fabricating a light emitting device as claimed in claim 20, wherein the carrier concentration of the dopant is adjusted within a range from $1 \times 10^{19}/cm^3$ to $5 \times 10^{18}/cm^3$.

22. The method of fabricating a light emitting device as claimed in claim 19, wherein in the second vapor-phase growth step the thickness of the current spreading layer is adjusted within a range from 5 μm to 200 μm.

23. The method of fabricating a light emitting device as claimed in claim 22, further comprising a step of forming a high-concentration doped layer in a surficial area including the main surface on the electrode forming side of the current spreading layer, where the high-concentration doped layer having a carrier concentration of the dopant for generating majority carriers higher than that in the residual portion of the current spreading layer.

24. The method of fabricating a light emitting device as claimed in claim 23, wherein in the second vapor-phase growth step the current spreading layer is formed by supplying a dopant gas together with a source gas for the Group III-V compound semiconductor;

and after the second vapor-phase growth step, the dopant is additionally diffused from the surficial portion of the current spreading layer to thereby form the high-concentration doped layer.

25. The method of fabricating a light emitting device as claimed in claim 24, wherein the current spreading layer is formed, using at least either of Zn and Mg as the dopant, as a p-type semiconductor layer, and the carrier concentration of the dopant is adjusted within a range from $2 \times 10^{18}/cm^3$ to $5 \times 10^{19}/cm^3$ for the high-concentration doped layer, and from $1 \times 10^{17}/cm^3$ $2 \times 10^{18}/cm^3$ for the residual portion.

26. The method of fabricating a light emitting device as claimed in claim 19, wherein the current spreading layer and a portion of the light emitting layer portion in contact with the current spreading layer are composed of Group III-V compound semiconductors differing from each other in the lattice constants, and the current spreading layer has an MO layer portion formed by the metal organic vapor-phase epitaxy process in a portion in contact with the light emitting layer portion, and has an HVPE layer portion formed by the hydride vapor-phase epitaxy process in the residual portion.

27. The method of fabricating a light emitting device as claimed in claim 19, further comprising a current blocking layer forming step for forming a current blocking layer which comprises a Group III-V compound semiconductor having a conductivity type different from that of the current spreading layer, as being buried in the current spreading layer; wherein at least a portion of the current spreading layer covering the current blocking layer on the electrode side is formed in the second vapor-phase growth step.

28. The method of fabricating a light emitting device as claimed in claim 27, wherein the current blocking layer forming step further comprises:

a third vapor-phase growth step for forming a first layer which composes a part of the current spreading layer and is composed of a first-conductivity-type Group III-V compound semiconductor, and a second layer which composes the current blocking layer and is composed of a second-conductivity-type Group III-V compound semiconductor, sequentially on the light emitting layer portion by the metal organic vapor-phase epitaxy process; and an etching step for removing an unnecessary portion of thus-obtained second-conductivity-type compound semiconductor layer so as to leave a portion to be the current blocking layer; and the second vapor-phase growth step is to form a third layer which comprises a Group III-V compound semiconductor having a conductivity type same as that of the first layer, so as to cover a portion of the second layer left unetched, by the hydride vapor-phase epitaxy process.

29. The method of fabricating a light emitting device as claimed in claim 28, wherein both of the first layer and the second layer are composed of an Al-free, Group III-V compound semiconductors.

30. The method of fabricating a light emitting device as claimed in claim 29, wherein all of the first layer, the second layer and the third layer are composed of $GaAs_{1-a}P_a$ ($0.5 \leq a \leq 0.9$).

31. The method of fabricating a light emitting device as claimed in claim 30, wherein a fourth layer is formed between the first layer and the second layer, where the fourth layer being composed of a Group III-V compound semiconductor different from those composing both layers; and in the etching step, the second layer is chemically removed by a selective etching using the fourth layer as an etch stop layer.

32. The method of fabricating a light emitting device as claimed in claim 31, wherein the thickness of the fourth layer is adjusted within a range from 1 nm to 100 nm.

33. The method of fabricating a light emitting device as claimed in claim 19, wherein the light emitting layer portion has a double heterostructure in which a first-conductivity-type cladding layer, an active layer and a second-conductivity-type cladding layer, all of which being composed of $(Al_xGa_{1-x})_yIn_{1-y}P$ (where, $0 \leq x \leq 1$ and $0 \leq y \leq 1$), are stacked in this order as viewed from the electrode side.

34. The method of fabricating a light emitting device as claimed in claim 33, wherein the first-conductivity-type cladding layer is composed of p-type $(Al_xGa_{1-x})_yIn_{1-y}P$.

35. The method of fabricating a light emitting device as claimed in claim 34, wherein the p-type dopant used for the first-conductivity-type cladding layer is at least either of Mg and C.

36. A method of fabricating a light emitting device having a light emitting layer portion and a current spreading layer, respectively composed of a Group III-V compound semiconductor, once formed on a single crystal substrate by epitaxial growth, wherein an off-angled substrate is used as the single crystal substrate;

and the method comprises:

a first vapor-phase growth step for forming the light emitting layer portion which comprises an alloy compound semiconductor containing two or more Group III elements on the off-angled, single crystal substrate based on the metal organic vapor-phase epitaxy process; and a second vapor-phase growth step, carried out after the light emitting layer portion was formed, for forming the current spreading layer based on the hydride vapor-phase epitaxy process.

37. The method of fabricating a light emitting device as claimed in claim 36, wherein the current spreading layer is formed, using at least either of Zn and Mg as the dopant, as a p-type $GaAs_{1-a}P_a$ ($0 \leq a \leq 1$) layer having a band gap energy larger than an optical energy corresponded to the peak emission wavelength of the light emitting layer portion.

38. The method of fabricating a light emitting device as claimed in claim 37, wherein the carrier concentration of the dopant is adjusted within a range from $1\times10^{17}/cm^3$ to $5\times10^{19}/cm^3$.

39. The method of fabricating a light emitting device as claimed in claim 36, wherein in the second vapor-phase growth step the thickness of the current spreading layer is adjusted within a range from 5 μm to 200 μm.

40. The method of fabricating a light emitting device as claimed in claim 36, further comprising a step of forming a high-concentration doped layer in a surficial area including the main surface on the electrode forming side of the current spreading layer, where the high-concentration doped layer having a carrier concentration of the dopant for generating majority carriers higher than that in the residual portion of the current spreading layer.

41. The method of fabricating a light emitting device as claimed in claim 40, wherein in the second vapor-phase growth step the current spreading layer is formed by supplying a dopant gas together with a source gas for the Group III-V compound semiconductor;

and after the second vapor-phase growth step, the dopant is additionally diffused from the surficial portion of the current spreading layer to thereby form the high-concentration doped layer.

42. The method of fabricating a light emitting device as claimed in claim 41, wherein the current spreading layer is formed, using at least either of Zn and Mg as the dopant, as a p-type semiconductor layer, and the carrier concentration of the dopant is adjusted within a range from $2\times10^{18}/cm^3$ to $5\times10^{19}/cm^3$ for the high-concentration doped layer, and from $1\times10^{17}/cm^3$ $2\times10^{18}/cm^3$ for the residual portion.

43. The method of fabricating a light emitting device as claimed in claim 37, wherein the current spreading layer is designed to have a portion on the electrode forming side a high-GaAs-alloy-composition $GaAs_{1-a}P_a$ ($0 \leq a<1$) layer having a GaAs alloy composition 1-a larger than that in the residual portion, and to have a high-concentration doped layer, containing Zn as the dopant, formed in the high-GaAs-alloy-composition $GaAs_{1-a}P_a$ layer.

44. The method of fabricating a light emitting device as claimed in claim 36, wherein the current spreading layer and a portion of the light emitting layer portion in contact with the current spreading layer are composed of Group III-V compound semiconductors differing from each other in the lattice constants, and the current spreading layer has an MO layer portion formed by the metal organic vapor-phase epitaxy process in a portion in contact with the light emitting layer portion, and has an HVPE layer portion formed by the hydride vapor-phase epitaxy process in the residual portion.

45. The method of fabricating a light emitting device as claimed in claim 36, further comprising a current blocking layer forming step for forming a current blocking layer which comprises a Group III-V compound semiconductor having a conductivity type different from that of the current spreading layer, as being buried in the current spreading layer; wherein at least a portion of the current spreading layer covering the current blocking layer on the electrode side is formed in the second vapor-phase growth step.

46. The method of fabricating a light emitting device as claimed in claim 45, wherein the current blocking layer forming step further comprises:

a third vapor-phase growth step for forming a first layer which composes a part of the current spreading layer and is composed of a first-conductivity-type Group III-V compound semiconductor, and a second layer which composes the current blocking layer and is composed of a second-conductivity-type Group III-V compound semiconductor, sequentially on the light emitting layer portion by the metal organic vapor-phase epitaxy process: and an etching step for removing an unnecessary portion of thus-obtained second-conductivity-type compound semiconductor layer so as to leave a portion to be the current blocking layer; and the second vapor-phase growth step is to form a third layer which comprises a Group III-V compound semiconductor having a conductivity type same as that of the first layer, so as to cover a portion of the second layer left unetched, by the hydride vapor-phase epitaxy process.

47. The method of fabricating a light emitting device as claimed in claim 45, wherein both of the first layer and the second layer are composed of an Al-free, Group III-V compound semiconductors.

48. The method of fabricating a light emitting device as claimed in claim 47, wherein all of the first layer, the second layer and the third layer are composed of $GaAs_{1-a}P_a$ ($0 \leq a \leq 1$) having a band gap energy larger than an optical energy corresponded to the peak emission wavelength of the light emitting layer portion.

49. The method of fabricating a light emitting device as claimed in claim 48, wherein a fourth layer is formed between the first layer and the second layer, where the fourth layer being composed of a Group III-V compound semiconductor different from those composing both layers; and in the etching step, the second layer is chemically removed by a selective etching using the fourth layer as an etch stop layer.

50. The method of fabricating a light emitting device as claimed in claim 49, wherein the thickness of the fourth layer is adjusted within a range from 1 nm to 100 nm.

51. The method of fabricating a light emitting device as claimed in claim 36, wherein the light emitting layer portion has a double heterostructure in which a first-conductivity-type cladding layer, an active layer and a second-conductivity-type cladding layer, all of which being composed of $(Al_xGa_{1-x})_yIn_{1-y}P$ (where, $0 \leq x \leq 1$ and $0 < y \leq 1$) containing two or more Group III elements, are stacked in this order as viewed from the electrode side.

52. The method of fabricating a light emitting device as claimed in claim 51, wherein the first-conductivity-type cladding layer is composed of p-type $(Al_xGa_{1-x})_yIn_{1-y}P$.

53. The method of fabricating a light emitting device as claimed in claim 36, wherein the single crystal substrate is a GaAs single crystal substrate having the main axis tilted by an angle within a range from 1° to 25° with respect to the <100> direction or <111> direction.

54. The method of fabricating a light emitting device as claimed in claim 53, wherein the single crystal substrate is a GaAs single crystal substrate having the main axis tilted by an angle within a range from 10° to 20°.

55. The method of fabricating a light emitting device as claimed in claim 54, wherein, in the second vapor-phase growth step, the current spreading layer composed of $GaAs_{1-a}P_a$ ($0 \leq a < 1$) is grown at 640° C. to 750° C. by the hydride vapor-phase epitaxy process.

* * * * *

UNITED STATES PATENT AND TRADEMARK OFFICE
CERTIFICATE OF CORRECTION

PATENT NO. : 6,777,257 B2
DATED : August 17, 2004
INVENTOR(S) : Masayuki Shinohara and Masato Yamada It is certified that error appears in the above-identified patent and that said Letters Patent is hereby corrected as shown below:

<u>Column 43,</u>
Line 59, delete "$1 \times 10^{19}/cm^3$" and substitute therefore -- $1 \times 10^{17}/cm^3$ --

Signed and Sealed this

Nineteenth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,777,257 B2
DATED : August 17, 2004
INVENTOR(S) : Masayuki Shinohara and Masato Yamada It is certified that error appears in the above-identified patent and that said Letters Patent is hereby corrected as shown below:

Column 43,
Line 59, delete "$1X10^{19}/cm^3$" and substitute therefore -- $1X10^{17}/cm^3$ -- --

Signed and Sealed this

Seventeenth Day of May, 2005

JON W. DUDAS
*Director of the United States Patent and Trademark Office*